(12) United States Patent
Higuchi et al.

(10) Patent No.: US 7,986,722 B2
(45) Date of Patent: Jul. 26, 2011

(54) NITRIDE SEMICONDUCTOR LIGHT EMITTING ELEMENT

(75) Inventors: Yu Higuchi, Anan (JP); Kunimichi Omae, Anan (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 12/603,301

(22) Filed: Oct. 21, 2009

(65) Prior Publication Data

US 2010/0098127 A1  Apr. 22, 2010

(30) Foreign Application Priority Data

Oct. 22, 2008 (JP) ................................. 2008-271870
Oct. 9, 2009 (JP) ................................. 2009-234800

(51) Int. Cl.
  *H01S 5/00* (2006.01)
  *H01S 3/097* (2006.01)
(52) U.S. Cl. ............. 372/50.124; 372/43.01; 372/50.11; 372/87
(58) Field of Classification Search ............. 372/50.124, 372/43.01, 46.01, 87
See application file for complete search history.

(56) References Cited

U.S. PATENT DOCUMENTS

| | | | |
|---|---|---|---|
| 6,160,833 A * | 12/2000 | Floyd et al. ........................ | 372/96 |
| 6,280,523 B1 | 8/2001 | Coman et al. | |
| 6,320,206 B1 | 11/2001 | Coman et al. | |
| 6,455,340 B1 | 9/2002 | Chua et al. | |
| 6,879,618 B2 * | 4/2005 | Cok et al. ........................ | 372/70 |
| 2002/0030198 A1 | 3/2002 | Coman et al. | |
| 2004/0004988 A1 * | 1/2004 | Cok et al. ........................ | 372/70 |
| 2004/0096996 A1 * | 5/2004 | Cheng et al. .................... | 438/22 |
| 2004/0184498 A1 * | 9/2004 | Ueki ................................. | 372/45 |
| 2005/0083979 A1 * | 4/2005 | Leary et al. ..................... | 372/43 |

FOREIGN PATENT DOCUMENTS

| | | |
|---|---|---|
| JP | H05-190979 A | 7/1993 |
| JP | 2000-228562 A | 8/2000 |
| JP | 2000-228563 A | 8/2000 |
| JP | 2003-234542 A | 8/2003 |
| JP | 2006-216816 A | 8/2006 |

OTHER PUBLICATIONS

Tien-Chang Lu et al.: "CW lasing of current injection blue GaN-based vertical cavity surface emitting laser" Applied Physics Letters 92, p. 141102(2008) Apr. 7, 2008.

(Continued)

*Primary Examiner* — Jessica T Stultz
*Assistant Examiner* — Phillip Nguyen
(74) *Attorney, Agent, or Firm* — Global IP Counselors, LLP

(57) ABSTRACT

A method of manufacturing a nitride semiconductor light emitting element includes: forming a stacked layer body of a nitride semiconductor having a second conductive-type layer, a light emitting layer, and a first conductive-type layer stacked on a growth substrate in this order; forming a first Bragg reflector made of a dielectric multilayer film above the first conductive-type layer; forming a first electrode over the first Bragg reflector with the first electrode being electrically connected to the first conductive-type layer; bonding the stacked layer body to a supporting substrate via the first Bragg reflector and the first electrode; removing the growth substrate from the stacked layer body to expose the second conductive-type layer; and forming over the exposed second conductive-type layer a second electrode and a second Bragg reflector made of a dielectric multilayer film so that the second Bragg reflector faces the first Bragg reflector across the stacked layer body.

20 Claims, 13 Drawing Sheets

OTHER PUBLICATIONS

Y. Higuchi et al., "Room-Temperature CW Lasing of a GaN-Based Vertical-Cavity Surface-Emitting Laser by Current Injection", 3 pages, Applied Physics Express 1 (2008) 121102, The Japan Society of Applied Physics, Japan.

K. Omae et al., "Improvement in Lasing Characteristics of GaN-based Vertical-Cavity Surface-Emitting Lasers Fabricated Using a GaN Substrate", 3 pages, Applied Physics Express 2 (2009) 052101, The Japan Society of Applied Physics, Japan.

* cited by examiner

NITRIDE SEMICONDUCTOR LIGHT EMITTING ELEMENT

CROSS-REFERENCE TO RELATED APPLICATIONS

This application claims priority to Japanese Application No. 2008-271870 filed in Japan on Oct. 22, 2008 and Japanese Application No. 2009-234800 filed on Oct. 9, 2009. The entire disclosures of Japanese Application Nos. 2008-271870 and 2009-234800 are incorporated hereinto by reference.

BACKGROUND OF THE INVENTION

1. Field of the Invention

The present invention relates to a method of manufacturing a nitride semiconductor light emitting element and to a nitride semiconductor light emitting element, and more particularly to a method of manufacturing a nitride semiconductor light emitting element and to a nitride semiconductor light emitting element capable of use as a vertical cavity surface emitting laser (VCSEL), a light emitting diode (LED), a photodetector (PD) or a combination of these devices.

2. Background Information

Studies on laser elements capable of functioning as a vertical cavity surface emitting laser have been conducted using a nitride semiconductor. However, in fact, there is only one reference in the world reporting oscillation of a vertical cavity surface emitting laser of nitride semiconductor by current injection (Applied physics letters, vol. 92, p 141102). Such a vertical cavity surface emitting laser has, as shown in FIG. 14, a construction in which a Bragg reflector 51, an n-type nitride semiconductor layer 52, a light emitting layer 53, and a p-type nitride semiconductor layer 54 are stacked on a sapphire substrate 50 in this order. The Bragg reflector 51 is made of a multilayer film of AlN/GaN.

Such a vertical cavity surface emitting laser has an insulating film 55 made of SiN formed on a side surface of a nitride semiconductor layer and an upper surface of a p-type nitride semiconductor layer 54, a transparent electrode 57 formed on the p-type nitride semiconductor layer 54, and a p-electrode 56 formed above the insulating film 55 so as to contact with the transparent electrode 57 and has an aperture. Formed over the transparent electrode 57 which is an aperture of the p-electrode 56 is a Bragg reflector 58 made of a dielectric multilayer film.

Further, a part of an n-type nitride semiconductor layer 52, the light emitting layer 53 and the p-type nitride semiconductor layer 54 are etched from the p-type nitride semiconductor layer 54 to form a protrusion shape with the n-type nitride semiconductor layer 52 exposed at the bottom, and an n-electrode 59 is formed on the exposed n-type nitride semiconductor layer 52.

Also, proposed is a method of fabricating a vertical cavity surface emitting laser, in which a nitride semiconductor layer and a first distributed Bragg reflector are formed on a sapphire substrate, an other substrate is bonded on the first distributed Bragg reflector, the sapphire substrate is removed, a second distributed Bragg reflector is formed so as to face the first distributed Bragg reflector, and electrodes are formed on the surfaces of the semiconductor layer (JP 2000-228562A, JP 2000-228563A, and JP 2003-234542A). Further, proposed is a surface emitting semiconductor laser in which periphery of the element is etched (JP H05-190979A). Moreover, proposed is a nitride semiconductor light emitting element in which after forming a mesa in a semiconductor layer, a part of the layer is oxidized (JP 2006-216816A).

In a case where a Bragg reflector is made of a nitride semiconductor, a Bragg reflector having electric conductivity and a high reflectance is difficult to obtain. As a result, a Bragg reflector made of a nitride semiconductor with extremely low electrical conductivity as described above or a dielectric material is usually used. Therefore, in a vertical cavity surface emitting laser, it is difficult to efficiently supply electric current to a light emitting layer which is interposed between the Brag reflectors facing each other. Also, as in a conventional structure, when a reflector is made of an insulating nitride semiconductor with extremely low electrical conductivity or a dielectric material, and two electric contact portions are formed on an upper surface (on the same plane) of the p-type layer and the n-type layer, uniform injection of electric current into the region contributing to laser oscillation (hereinafter referred to as the "element region") is difficult to achieve and the current density becomes locally high. Therefore, the matching of lateral distribution of light and gain becomes insufficient, resulting in a high threshold current. In addition, the current input becomes high, so that heat generated in the element region cannot be released, resulting in significant reduction of the emission efficiency.

On the other hand, as described in JP 2000-228562A, JP 2000-228563A, and JP 2003-234542A, in a case where using an other substrate which is different from a growth substrate, a p-electrode is formed in a region away from the element region, the electric current is difficult to spread in the p-type layer in a nitride semiconductor. Therefore, the electric current tends to crowd in a peripheral portion of the p-electrode and the current density becomes locally high. As a result, the electric current cannot be injected into the element region, so that emission and oscillation are difficult to achieve.

In addition, in a case where a mesa structure or a selectively oxidized layer is formed to reduce the threshold, the electric current path is narrowed and the heat generation is significantly increased.

SUMMARY OF THE INVENTION

The present invention is directed to solve the problems described above. An object of the present invention is to uniformly distribute the current supplied to the element region, to minimize the effect of the heat so as to obtain a light emitting element having high efficiency and to manufacture such a high performance light emitting element easily and with good reproducibility. In the present specification, the term an "oscillation" means a laser oscillation.

A method of manufacturing a nitride semiconductor light emitting element includes: forming a stacked layer body of a nitride semiconductor having a second conductive-type layer, a light emitting layer, and a first conductive-type layer stacked on a growth substrate in this order; forming a first Bragg reflector made of a dielectric multilayer film above the first conductive-type layer; forming a first electrode over the first Bragg reflector with the first electrode being electrically connected to the first conductive-type layer; bonding the stacked layer body to a supporting substrate via the first Bragg reflector and the first electrode; removing the growth substrate from the stacked layer body to expose the second conductive-type layer; and forming over the exposed second conductive-type layer a second electrode and a second Bragg reflector made of a dielectric multilayer film so that the second Bragg reflector faces the first Bragg reflector across the stacked layer body.

In such a method of manufacturing a nitride semiconductor light emitting element, it is preferable that a first transparent electrode is formed on the first conductive-type layer, the first Bragg reflector is formed directly over the first transparent electrode, and the first electrode is formed to be electrically connected to the first conductive-type layer via the first transparent electrode.

Further, a connecting electrode is preferably formed on a side surface of the first Bragg reflector or penetrating through the first Bragg reflector so that the first transparent electrode and the first electrode are electrically connected.

A side surface of the stacked layer body is preferably covered with an insulating film and a metal film in this order. It is preferable that after forming the stacked layer body, a part of the stacked layer body is removed from the first conductive-type layer side and processed into a protrusion. It is preferable that the connecting electrode is formed to cover a side surface of the protrusion. It is preferable that after removing the growth substrate, a part of the stacked layer body is removed from the second conductive-type layer side and processed to have a width wider than a width of the protrusion and narrower than a width of the connecting electrode. It is preferable that a second transparent electrode is formed on the second conductive-type layer and the second Bragg reflector is formed over the second transparent electrode, and wherein the second electrode is formed so as to be electrically connected to the second transparent electrode.

Moreover, a nitride semiconductor light emitting element of the present invention includes a supporting substrate, a first Bragg reflector made of a dielectric multilayer film, a stacked layer body of nitride semiconductor disposed on an opposite side of the first Bragg reflector from the supporting substrate, the stacked layer body having a first conductive-type layer, a light emitting layer, and a second conductive-type layer stacked in this order, a second Bragg reflector made of a dielectric multilayer film and facing the first Bragg reflector across the stacked layer body, stacked in this order, and a first electrode electrically connected to the first conductive-type layer with the first electrode being disposed between the supporting substrate and the first Bragg reflector.

In this nitride semiconductor light emitting element, it is preferable that the first electrode is electrically connected to the first conductive-type layer via the first transparent electrode which is disposed between the first Bragg reflector and the first conductive-type layer and is disposed to be exposed from the first Bragg reflector. In other words, the first transparent electrode preferably protrudes outwardly from the first Bragg reflector in a direction perpendicular to a stacking direction of the stacked layer body. It is preferable that the first electrode and the first conductive-type layer are electrically connected via a connecting electrode disposed on a side surface of the Bragg reflector or disposed penetrating through the first Bragg reflector. The connecting electrode preferably has a width smaller than a width of the supporting substrate.

It is preferable that the stacked layer body has a side surface covered with an insulating film and a metal film in this order. It is preferable that the stacked layer body of the first conductive-type layer side has a width smaller than a stacked layer body of the second conductive-type layer side. It is preferable that the second Bragg reflector is disposed to cover a region facing the first Bragg reflector across the stacked layer body.

It is preferable that an insulating layer having an aperture is disposed contiguous to the first conductive-type layer and a second electrode having an aperture is disposed on the second conductive-type layer, the first Bragg reflector is disposed on a first transparent electrode disposed so as to cover the aperture of the insulating layer, the second Bragg reflector is disposed at least at the aperture of the second electrode, and the second Bragg reflector has an area larger than an area of the first Bragg reflector. It is preferable that the insulating layer is disposed above the connecting electrode. In the nitride semiconductor light emitting element, light is preferably extracted from the second Bragg reflector side.

According to a method of manufacturing a nitride semiconductor light emitting element of the present invention, current can be uniformly injected into the element region to reduce the heat generation, so that a light emitting element having high efficiency can be manufactured easily and with good reproducibility. Moreover, in a nitride semiconductor light emitting element of the present invention, the current distribution supplied to the element region can be uniformed so that the lateral profile of light and gain can be matched and generation of heat by the element can be reduced.

DETAILED DESCRIPTION OF THE PREFERRED EMBODIMENTS

Figure 1:
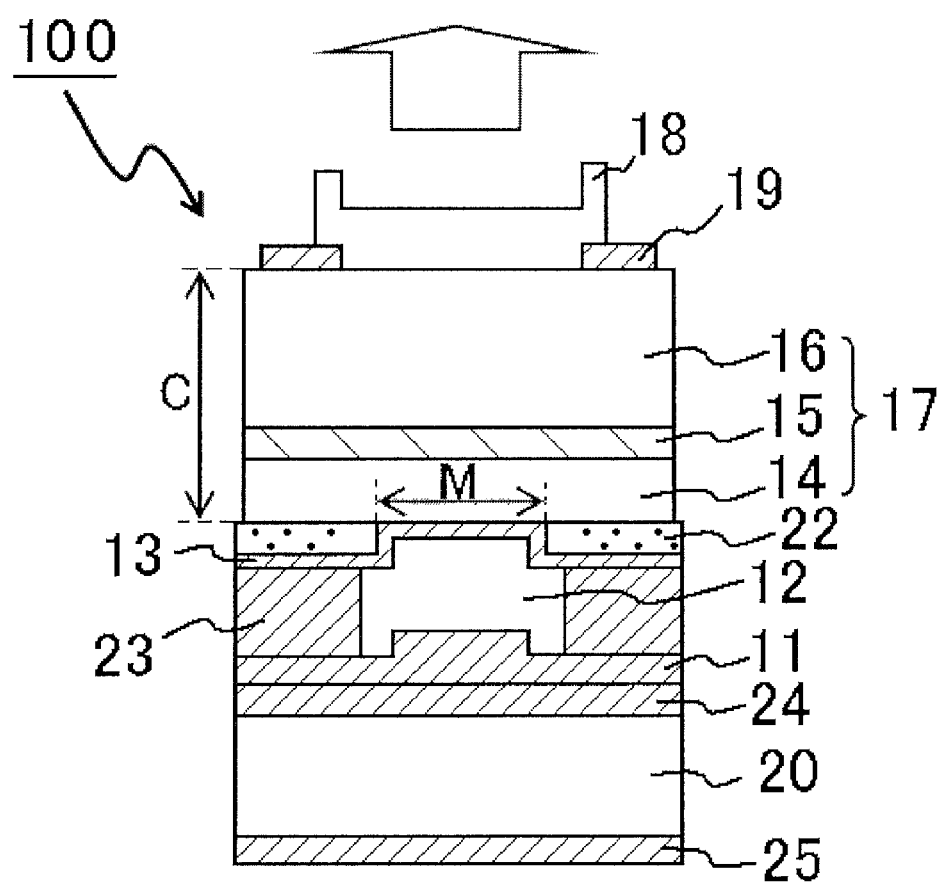
FIG. 1 is a schematic cross-sectional view illustrating a structure of a nitride semiconductor light emitting element according to one embodiment of the present invention.

In a method of manufacturing a nitride semiconductor light emitting element of the present invention, first, a substrate for growing a stacked layer body of a nitride semiconductor is prepared. The substrate may be of any suitable material that does not constitute a nitride semiconductor light emitting element in the final product and that allows the growth of layer of high quality nitride semiconductor thereon. Examples of such a substrate include, an insulating substrate such as sapphire or spinel ($MgAl_2O_4$) having principal plane in C plane, M plane, A plane or R plane; silicon carbide, silicon, ZnS, ZnO, GaAs, diamond; an oxide substrate such as lithium niobate or neodymium gallate which can provide a lattice match with nitride semiconductor; and a nitride semiconductor substrate (such as GaN and AlN) having principal plane in C plane, M plane, A plane, R plane, (11-22) plane, or (20-21) plane. Also, such a substrate may have an offset angle of from about 0° to about 10° in a first principal plane and/or a second principal plane.

Next, a stacked layer body of nitride semiconductor is grown on the substrate. A crystal nucleation layer, a low temperature growth buffer layer, a high temperature growth layer, a mask layer, or an intermediate layer may be formed appropriately as an underlayer, according to the substrate to be used. For this reason, in the present specification, the terms "above" and "over" include in their meanings not only "right above" and "directly above", but also "in a higher position than".

The nitride semiconductor preferably has a general formula, for example, $In_xAl_yGa_{1-x-y}N$ ($0 \leq x \leq 1$, $0 \leq y \leq 1$, and $0 \leq x+y \leq 1$). In addition, B may be substituted partially as Group III element and a part of N may be substituted by P and/or As as Group V element. Particularly, an emission of longer wavelength can be obtained by increasing the content of In and an emission in the ultraviolet region can be obtained by increasing the content of Al in the light emitting layer. Therefore, an emission in a wavelength range of about 300 nm to 650 nm can be obtained.

The first conductive-type layer and the second conductive-type layer mean either of one is of an n-type and the other is of a p-type. The n-type layer may contain one or more elements of group IV elements or group VI elements or the like, such as Si, Ge, Sn, S, O, Ti, Zr, and Cd, as an n-type impurity. The p-type layer may contain one or more elements, such as Mg, Zn, Be, Mn, Ca, Sr, or the like, as the p-type impurity. The impurity is preferably contained in a concentration region of, for example, about $5 \times 10^{16}/cm^3$ to $1 \times 10^{21}/cm^3$. It is not necessary that all of the semiconductor layers constituting the first and second conductive-type layers contain an impurity.

For example, the first conductive-type layer (hereinafter may be referred to as a "p-type layer"), the light emitting layer, and the second conductive-type layer (hereinafter may be referred to as an "n-type layer") may have a single layer structure, a multilayer structure, or a superlattice structure including two layers of different composition ratio. These layers may include a composition gradient layer and/or a concentration gradient layer. The light emitting layer preferably has a quantum well structure such as a single quantum well structure and a multiquantum well structure. With this arrangement, the emission efficiency can be improved.

Specifically, the second conductive-type layer can be made as a stacked layer structure which contains at least one layer of a contact layer, a cladding layer, or the like, in this order from the growth substrate side. The first conductive-type layer can be made as a stacked layer structure which contains at least one layer of a cladding layer, and a contact layer in this order from the light emitting layer side. The thicknesses of such layers are not particularly limited. It is preferable that the thicknesses of the layers are suitably adjusted so that a surface emission can be effectively achieved. For example, the second conductive-type layer may be about 0.2 to 12 µm, the light emitting layer may be about 15 to 300 nm, and the first conductive-type layer may be about 10 to 120 nm.

Also, the second conductive-type layer may be stacked on the first conductive-type layer to form a tunnel junction. In such a case, the electric current can be spread at the first conductive-type layer side without using a transparent electrode. Therefore, light absorption by the transparent electrode can be substantially eliminated, so that a nitride semiconductor light emitting element capable of emitting and/or oscillating effectively can be obtained.

As described below, in a case where the resonator length is controlled by etching of the stacked layer body, an etching stopping layer may be inserted in the second conductive-type layer to facilitate the adjustment. The material of the etching stopping layer is not particularly limited and, for example, any material which is more difficult to be etched than the second conductive-type layer by the etchant used in the etching step can be employed. Examples thereof include a layer made of AlGaN whose Al composition ratio is about 0.1 to 0.3. The thickness of the etching stopping layer is not particularly limited and may be, for example, about 10 to 50 nm.

Figure 12:
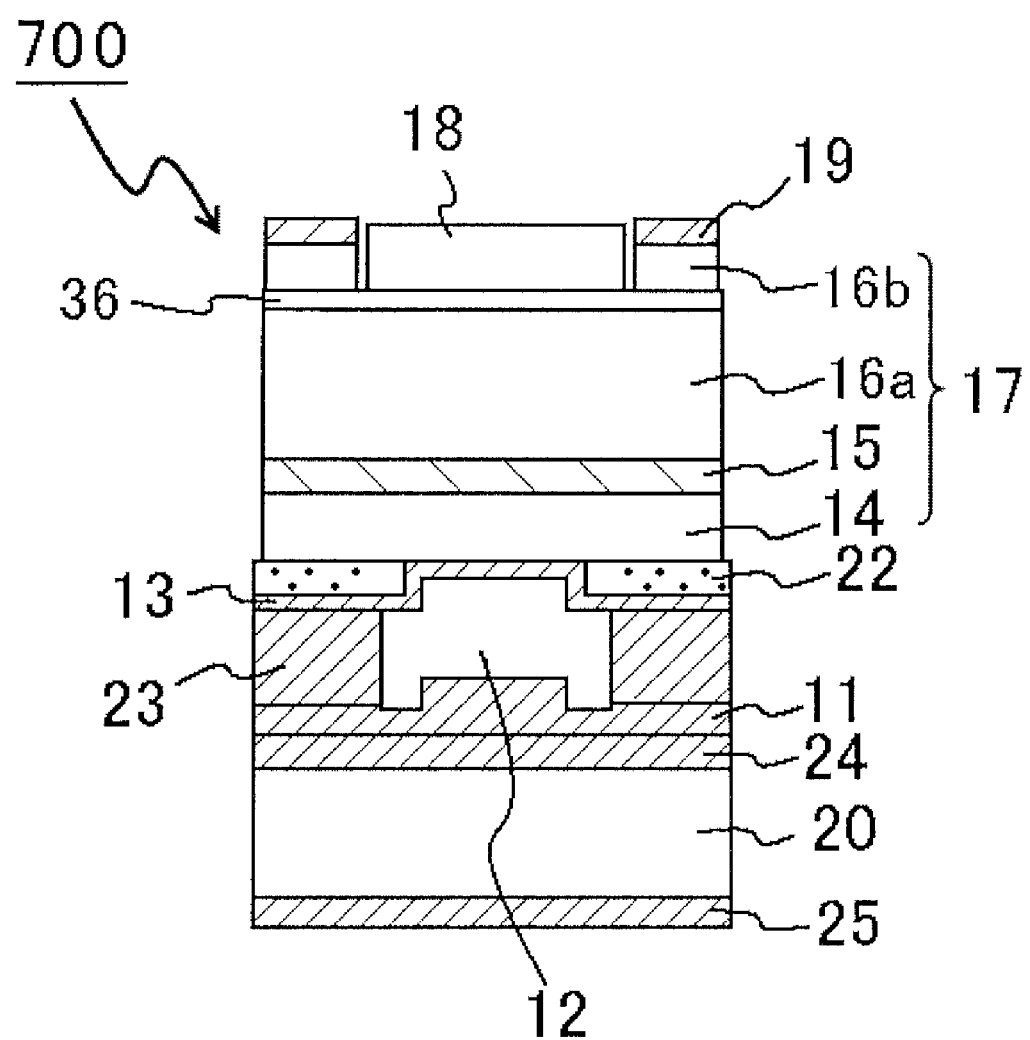
FIG. 12 is a schematic cross-sectional view of a structure of a nitride semiconductor light emitting element according to yet another embodiment of the present invention.

Also, as shown in FIG. 12, the thickness of the element region may be smaller than the other regions. Retaining the thickness of the electrode forming portion, which is a different region from the element region, allows high concentration addition of an impurity to the semiconductor layer, reduction of resistance, and improvement in uniformity of current injection, so that a light emitting element of high efficiency can be obtained.

Growth method of the nitride semiconductor is not particularly limited and any method known as a growth method of nitride semiconductor such as MOVPE (Metal-Organic Vapor Phase Deposition), MOCVD (Metal-Organic Chemical-Vapor Deposition), HVPE (Hydride Vapor Phase Epitaxy), MBE (Molecular Beam Epitaxy), and so on, can be employed. In particular, since MOCVD can provide excellent crystallinity under reduced pressure to atmospheric pressure, it is preferably employed.

Figure 8:
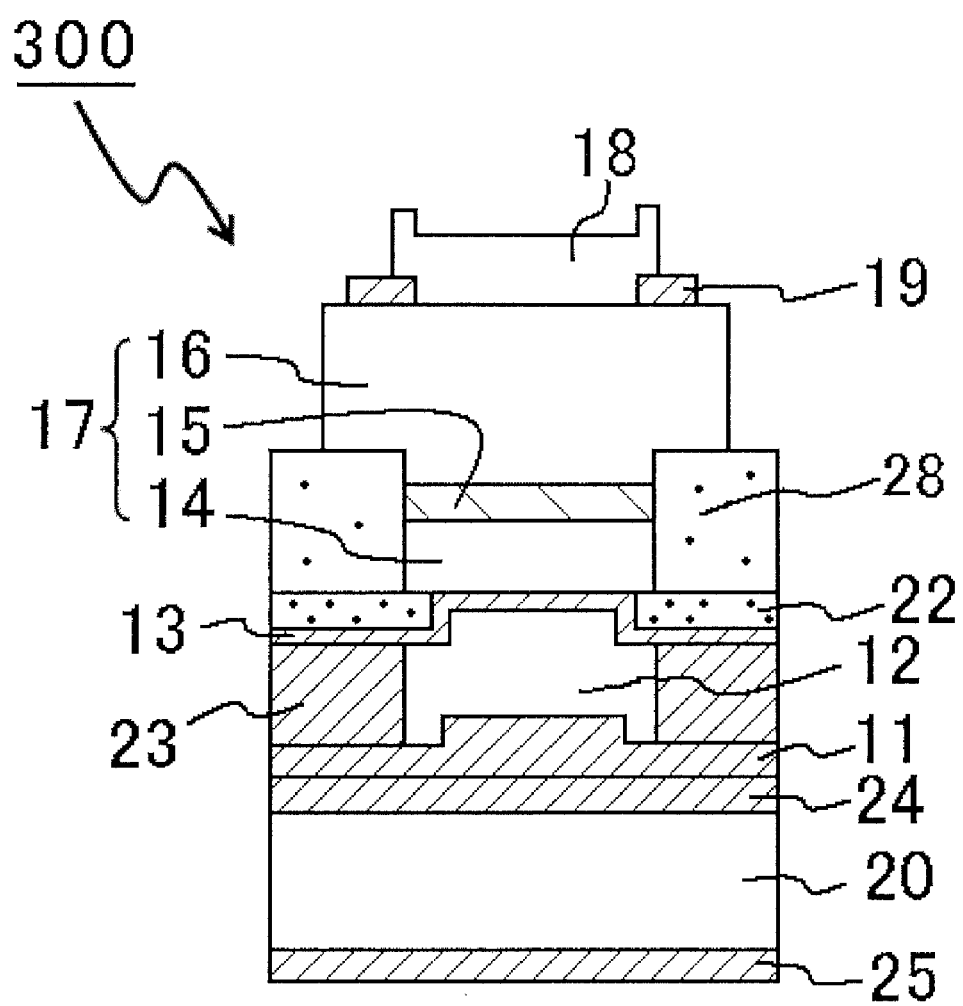
FIG. 8 is a schematic cross-sectional view of a structure of a nitride semiconductor light emitting element according to yet another embodiment of the present invention.
Figure 10:
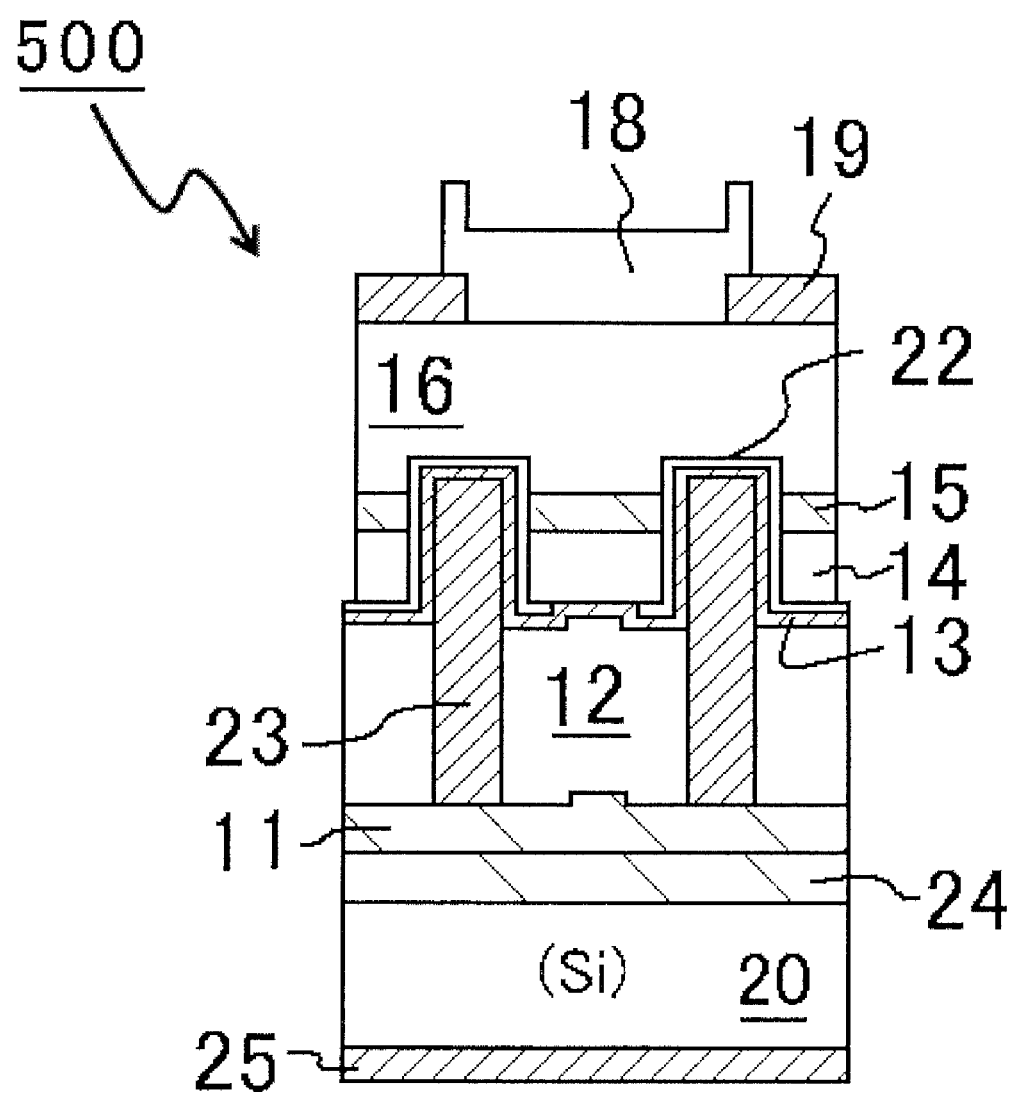
FIG. 10 is a schematic cross-sectional view of a structure of a nitride semiconductor light emitting element according to yet another embodiment of the present invention.

It is preferable to form the stacked layer body in a protrusion shape as shown in FIG. 8, FIG. 10, and the like, after forming the stacked layer body of the nitride semiconductor and before forming the first transparent electrode which will be described below. With this arrangement, the effect of lateral confinement of light in the element region can be improved and a nitride semiconductor light emitting element capable of emitting light and/or oscillating with higher efficiency can be realized. In the present specification, the term "element region" means, as shown as M in FIG. 1, a region interposed between the opposing Bragg reflectors among the semiconductor layers to which an electric current is injected.

Herein, the protrusion shape is preferably formed by etching a part of the stacked layer body from a side of the first conductive-type layer into its thickness. A part of the stacked layer body disposed in the outside of the element region can be etched into the entire thickness direction (stacking direction) of the first conductive type layer and the light emitting layer, and further, into a part of the second conductive-type layer. In view of lateral light confinement within the waveguide and current confinement, etching is preferably carried out throughout the first conductive type layer and the light emitting layer into a part of the second conductive-type layer. In view of suppression of high-order lateral mode, etching is preferably carried out part into a part of the first conductive-type layer. Etching is not necessarily carried out on the entire outside of the element region, and as shown in FIG. 10, etching may be carried out to form one or more groove or circular hole with a predetermined depth.

The etching method is not particularly limited and, for example, a mask pattern having a predetermined size is formed on a surface of the nitride semiconductor layer and etching is carried out by using the mask pattern as a mask. The mask pattern can be formed by patterning an insulating material, or the like, such as a resist, $SiO_2$, or the like, into an appropriate shape by way of a known method such as photolithography and etching The shape of the mask pattern is not particularly limited and a circular shape, an oval shape, a rectangular shape, and the like can be selected to obtain a desired property. A circular shape is preferred from the view point of confinement of light, and an oval shape is preferred to attain a stable polarization property.

The etching may use either a dry etching process or a wet etching process. Wet etching can be carried out by, for example, soaking a nitride semiconductor layer in an alkaline aqueous solution such as potassium hydroxide solution, sodium hydroxide solution, or an acid solution such as phosphoric acid solution, sulfuric acid solution, or aqua regia for a predetermined period of time to expose the nitride semiconductor layer to an etchant.

The dry etching can be carried out, for example, by Reactive Ion Etching (RIE), Reactive Ion Beam Etching (RIBE), Electron Cyclotron Resonance (ECR) etching, or ion beam etching, or the like. In any case, the etching gas (for example, a single or a mixture of a fluorine-based etching gas such as $CF_4$, a chlorine-based etching gas such as $Cl_2$, $CCl_4$, and $SiCl_4$, and an iodine-based etching gas such as HI) can be selected suitably. Among these etching methods, dry etching is preferably used. When dry etching is performed, etching conditions including the type of etching gas (such as gas flow rate, RF power, pressure, temperature, and etching time) can be suitably adjusted.

As described above, in a case where the stacked layer body is formed into a protrusion, as a result, the stacked layer body has different widths. That is, in the final state of the element, the stacked layer width at the after-mentioned first transparent electrode (supporting substrate side) side can be made smaller than the stacked layer body width at the second electrode side. With this arrangement, lateral confinement of light can be reliably achieved. It also allows the electric current to be constricted. Therefore, a nitride semiconductor light emitting element capable of emitting and/or oscillating at a high efficiency can be obtained.

It is preferable a side surface and/or a part of upper surface of the stacked layer body is covered with an insulation film or the like. Also, it is preferable that in a case where the stacked layer body is formed with a protrusion shape, the entire surface of the side surface of the protrusion, more preferably, the side surface and a part of the upper surface of the protrusion is covered with an insulation film or the like (see reference numerals 29 in FIG. 7, 28 in FIG. 8, and 22 in FIG. 10). Formation of the insulating film on the stacked layer body or the protrusion can be performed by using a known method in the art. The insulating film herein is preferably made of a material having a smaller refractive index than that of the stacked layer body. Also, in view of the lateral confinement of light, the insulating film preferably has a refractive index smaller than that of the after-mentioned first transparent electrode. In view of suppressing generation of a higher-order lateral mode, a refractive index of the insulating film is preferably larger than that of the first transparent electrode. Further, in view of heat dissipation characteristics, a material having high thermal conductivity is preferable. Examples of such material include an oxide such as $SiO_2$, $Ga_2O_3$, $Al_2O_3$, $ZrO_2$, a nitride such as SiN, AlN and AlGaN. The thickness of the insulating film may be, for example, about 20 to 1000 nm. Also, the insulating films on the upper surface and the side surface of the protrusion may be made of different materials. Lateral confinement of light can be appropriately achieved by suitably employing the materials having different refractive indices.

It is preferable that a metal film, particularly a metal film having high thermal conductivity is formed on and at the periphery of the insulating film. With this arrangement, heat generated by constricting the electric current due to the protrusion shape can be released more efficiently, so that a nitride semiconductor light emitting element capable of emitting and/or oscillating more efficiently can be obtained.

The metal film herein is formed so that the film is disposed at the periphery of the insulating film. For example, the metal film is disposed to be connected with or to serve as the first electrode or the connecting electrode for ensuring the supply of electric current to the first transparent electrode which is to be described below. In this case, the metal film is formed so as to cover both the entire surface of the side surface of the protrusion and a side surface of the after-mentioned first transparent electrode and the first Bragg reflector. In any case, in view of heat dissipation characteristics, the material of the metal film preferably has a high thermal conductivity, and a same material as that used for the after-mentioned first electrode or the connecting electrode can be appropriately selected. As described above, the element region is the region contributing to the laser oscillation and electric current is injected into the element region, so that the region has a highest heat generation in the laser element. Providing an insulating film and a metal film so as to surround the side surface of the element region allows the above described effects to be more significant.

Forming the first transparent electrode on the first conductive-type layer allows lateral spread of electric current, so that electric current can be supplied to the element region effectively. The material of the electrode is not particularly limited as long as it is transparent, for example, it can transmit 50% or more of light incident to the transparent electrode, preferably, it can transmit 60% or more, 70% or more, and further, 80% or more of the light. The optical absorption by the transparent electrode is preferably 3% or less, more preferably 1% or less of light incident to the transparent electrode. For example, the first transparent electrode can be formed with a single film or a multi film including at least one element selected from the group consisting of zinc (Zn), indium (In), tin (Sn), and magnesium (Mg). Moreover, the first transparent electrode is preferably made of a conductive oxide, such as for example, ZnO, $In_2O_3$, $SnO_2$, ATO, ITO, and MgO. Among them, ITO is preferable. The film thickness is not particularly limited, but a thinner film is preferable so as to minimize the effect of light loss due to optical absorption by the first transparent electrode. On the other hand, if the film is too thin, resistance increases. Therefore, the film thickness can be adjusted to find the balance of the both. For example, a thickness of about 5 to 100 nm is employed.

The first transparent electrode may be formed to be in contact with the entire surface on the first conductive-type layer which is a constituent of the light emitting element, but it is preferable that the first transparent electrode is formed to be partially in contact with the surface. The first transparent electrode may be disposed via an insulating layer as shown as 22 in FIG. 1 or the like, on a part of the entire or a part of the first conductive-type layer. Further, as described above, in a case where the stacked layer body is formed as a protrusion shape, the first transparent electrode is preferably disposed on the entire or approximately entire upper surface of the protrusion. Also, the first transparent electrode is preferably formed exposed from the first Bragg reflector, in order to be in contact with the after-described connecting electrode or the first electrode.

In an example of such arrangement, the center portion of upper surface of the first conductive-type layer is in direct contact with the first transparent electrode and the first transparent electrode is disposed thereto via an insulating layer to the portion surrounding the center portion. In other words, it is preferable that an insulating layer with an aperture is formed in contact with the first conductive-type layer and the first transparent electrode is formed at least in the aperture.

By forming the first transparent electrode as described above, supply of electric current which tends to concentrate in the peripheral portion of the element region can be directed to the center portion and uniform supply of electric current within the element region can be achieved. As a result, gain at the center of the element region can be increased and the conformity of lateral light and distribution of gain can be increased, so that emission and/or oscillation can be performed efficiently. The after-described connecting electrode or the first electrode is preferably disposed to be in contact with the first transparent electrode on the insulating layer. This enables to prevent such a case that if the after-described connecting electrode or the first electrode is disposed to the region where the first transparent electrode is in contact with the first conductive-type layer, the electric current flows only to the area immediately beneath the connecting electrode or the first electrode, and the electric current is suppressed from spreading into the center portion of the element.

The insulating layer herein is provided so as to inject the electric current into a desired region. The material of the insulating layer preferably has a refractive index smaller than that of the nitride semiconductor and/or the first transparent electrode. With such a refractive index, lateral confinement of light can be securely achieved. In view of suppressing generation of a higher-order lateral mode, a refractive index of the insulating layer is preferably larger than that of the first transparent electrode. Examples thereof include an oxide such as $SiO_2$, $Ga_2O_3$, $Al_2O_3$, $ZrO_2$ and the like, a nitride such as SiN, AlN, AlGaN and the like. The insulating layer described above can be omitted. Other than the method of providing the insulating layer, any known method in the art can be used as a method of injecting electric current into a desired region, such as ion implantation, selective oxidation (thermal oxidation, anodic oxidation or the like), or the first conductive-layer and the first transparent electrode are made as Schottky contacts or the like.

Next, a first Bragg reflector is formed above the aforementioned stacked layer body of the nitride semiconductor. The first Bragg reflector may be formed directly on the stacked layer body (as in FIG. 13A), or for example, on the first transparent electrode, and preferably formed to cover the insulating layer (as in FIG. 1 or the like).

The first Bragg reflector is made of a dielectric multilayer film. Examples of the dielectric body used herein include an oxide of Si, Mg, Al, Hf, Nb, Zr, Sc, Ta, Ga, Zn, Y, B, Ti, a nitride (for example, AlN, AlGaN, GaN, BN or the like) and a fluoride. Specifically, $SiO_2$, $TiO_2$, $Nb_2O_5$, $ZrO_2$, $Ta_2O_5$, $HfO_2$ and the like are exemplified. A dielectric multilayer film can be obtained by alternately stacking two or more material layers of above-described dielectric bodies with different refractive indices. For example, a multilayer of $SiO_2/Nb_2O_5$, $SiO_2/ZrO_2$, $SiO_2/AlN$ or the like is preferable.

Material, film thickness, number of multilayer pairs or the like can be suitably adjusted to obtain a desired reflectance. The film thickness of each layer can be suitably adjusted by material to use, and determined by the desired oscillation wavelength ($\lambda$) and the refractive index (n) of the material at $\lambda$. Specifically, the film thickness is preferably an odd number multiple of $\lambda/(4n)$ and preferably adjusted in view of reflectance and heat dissipation characteristics. For example, in a case where the dielectric multilayer film is made of $SiO_2/Nb_2O_5$ in an element with an oscillation wavelength of 410 nm, the film thickness of about 40 to 70 nm may be employed. The repetition number of stacking layers may be 2 or more, preferably about 5 to 15. The film thickness of the dielectric multilayer film is, for example, about 0.6 to 1.7 μm.

The uppermost layer of the first Bragg reflector is preferably made of a material having a lower refractive index among the multilayer constituting the first Bragg reflector. With this arrangement, the reflectance at the interface with the first electrode disposed on the first Bragg reflector can be increased. In a case where a transparent electrode is used, in view of longitudinal standing wave, the thickness of the first conductive layer and the first layer of the first Bragg reflector are preferably adjusted so that the active layer locates at anti-node of the standing wave and the transparent electrode locates at node of the standing wave.

The size and shape of the first Bragg reflector is not particularly limited as long as it covers the element region. Specifically, a shape such as a circle, oval, rectangle, and the like with a predetermined size can be employed. In a case where a circular shape is employed, the diameter of about 5 to 70 μm is preferable. Also, it is preferable that forming the first Bragg reflector smaller than the supporting substrate and stacked layer body enables formation of the connecting electrode and the metal film on a side surface of the Bragg reflector, and good heat release can be obtained.

The dielectric multilayer film can be formed by any method known in the art. Various methods can be employed, for example, a vapor-deposition method, a sputtering method, a reactive sputtering method, an ECR plasma sputtering method, a magnetron sputtering method, an ion beam assist deposition method, an ion plating method, a laser ablation method, a CVD method, a spray method, a spin coat method, a dip method, or a combination of two or more of such methods, further, a combination of such methods and at least one of full or partial pretreatment, irradiation of inert gas (Ar, He, Xe, and the like) or plasma, irradiation of oxygen or ozone gas or plasma, oxidation treatment (heat treatment), and exposure treatment. In addition, in such a combinational method, film formation and/or processing is not necessarily conducted simultaneously or continuously and a processing can be performed after film formation or vice versa.

A connecting electrode for supplying electric current to the first transparent electrode is preferably formed before or after formation of the first Bragg reflector. The connecting electrode is disposed so that the first transparent electrode and the after-described first electrode are electrically connected. It is preferable that the connecting electrode is disposed on a side surface of the first Bragg reflector and in contact with the first transparent electrode, or formed penetrating through the first Bragg reflector and in contact with the first transparent electrode. Herein, the connecting electrode can be formed in other ways as long as the connecting electrode can supply electric current to the first transparent electrode. The connecting electrode can be omitted according to the structure of the first electrode.

For example, in the cases where the connecting electrode 23 is arranged as shown in FIG. 1 and the like, the contact area between the connecting electrode 23 and the first transparent electrode can be appropriately adjusted according to the material, the size of the nitride semiconductor light emitting element, and the like. The film thickness of the connecting electrode is not particularly limited, but it is preferably formed such that the upper surface of the connecting electrode is about the same height as the upper surface of the first Bragg reflector. It is preferable that with this arrangement, the stacked layer body and the supporting substrate can be bonded firmly and detachment of the stacked layer body during the manufacturing process or the like can be prevented.

In a case where the connecting electrode is formed on a side surface of the first Bragg reflector, as described above, it can be served as a metal film for improving the heat dissipation characteristics.

Figure 9:
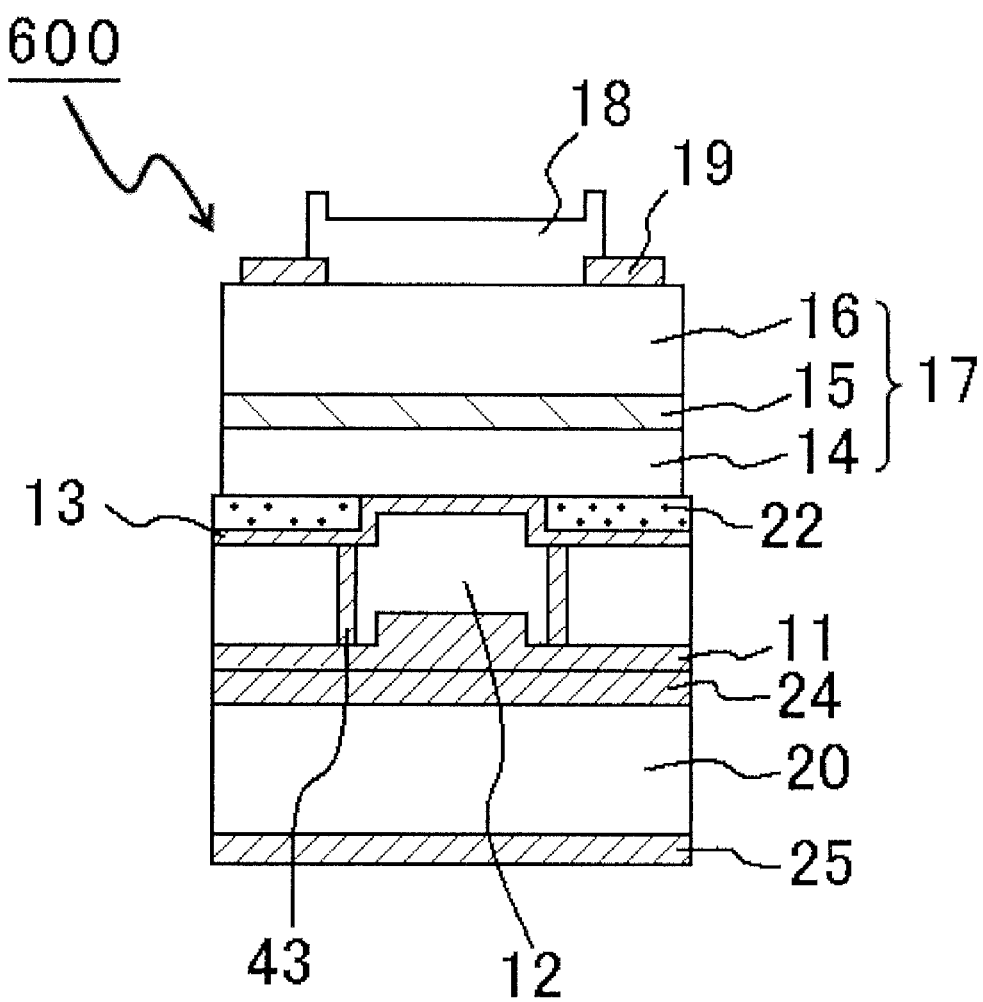
FIG. 9 is a schematic cross-sectional view of a structure of a nitride semiconductor light emitting element according to yet another embodiment of the present invention.

Also, as shown in FIG. 9, in a case where the connecting electrode 43 is formed penetrating through the first Bragg reflector, the position of penetration is not particularly limited and it is preferable to adjust it to a position capable of uniformly supplying electric current to the element region. Further, it is preferable to adjust it so that an appropriate contact area between the first electrode and the first transparent electrode can be secured. For example, the connecting electrode may be disposed near the above-described portion where the first conductive-type layer and the first transparent electrode directly contact each other, with one or more contact points, or may be disposed in an annular shape which is divided into one or more portions so as to surround the portion where the first conductive-type layer and the first transparent electrode directly contact each other.

The connecting electrode can be formed with a metal, a single layer or stacked layer of an alloy containing at least one selected from the group consisting of nickel (Ni), gold (Au), platinum (Pt), indium (In), aluminum (Al), germanium (Ge), silicon (Si), tin (Sn), palladium (Pd), rhodium (Rh), ruthenium (Ru), osmium (Os), iridium (Ir), titanium (Ti), zirconium (Zr), hafnium (Hf), vanadium (V), niobium (Nb), tantalum (Ta), cobalt (Co), iron (Fe), manganese (Mn), molybdenum (Mo), chromium (Cr), tungsten (W), lanthanum (La), copper (Cu), silver (Ag), yttrium (Y), zinc (Zn), an oxide or nitride of these metals, and a transparent conductive oxide such as ITO, ZnO, and $In_2O_3$. Among them, a material having a low resistance is preferable. In view of heat dissipation characteristics, a material having a high thermal conductivity is preferable. Examples thereof include electrode materials of Ti—Rh—Au system, Ni—Au system, Ni—Au—Pt system, Pd—Pt system, Ni—Pt system, and Cr—Pt—Au system.

Then, a first electrode is formed on the first Bragg reflector. As described above, the reflectance at the interface with the first electrode can be increased by using a material having a lower refractivity among the multilayer constituting the first Bragg reflector for the uppermost layer of the first Bragg reflector. In addition, the reflectance at the interface with the first electrode can be further increased by selecting a metal material having a high reflectance. The first electrode is preferably formed not only on the first Bragg reflector, but also above the entire surface on the stacked layer body of the nitride semiconductor (or above an insulating layer if it is formed). Forming the first electrode on the entire surface thereof allows the first electrode to be bonded more firmly onto the after-described supporting substrate. Accordingly, crack or detachment of the nitride semiconductor layer in the subsequent steps can be prevented. Further, the subsequent steps can be carried out at the wafer level, so that good mass productivity can be achieved. The first electrode is not needed to be made of the same material throughout the whole surface, and it may be such that after applying a different material on the first Bragg reflector (or on the element region), a same material is applied on the whole surface.

Materials generally used for the aforementioned connecting electrode, metallization layer or metallization electrode may also be used for the first electrode. Examples thereof include, from the first Bragg reflector side, (Ti/Si)—Pt—Pd, Ti—Pt—Au—(Au/Sn), Ti—Pt—Au—(Au/Si), Ti—Pt—Au—(Au/Ge), Ti—Pt—Au—In, Au—Sn, In, Au—Si, Au—Ge, Al—Rh—Au—(Au/Sn).

Then, the stacked layer body is bonded to the supporting substrate through the first electrode and the first Bragg reflector. As described above, by forming the first electrode between the first Bragg reflector and the supporting substrate, the heat dissipation characteristics of the element can be improved. That is, compared to the case where the first Bragg reflector and the stacked layer body or growth substrate are in contact with each other, the heat generated in the light emitting layer can be rapidly dispersed in the first electrode and the connecting electrode, so that heat can be effectively released to the supporting substrate side.

Example of the supporting substrate include an insulating body such as AlN, a semiconductor substrate made of semiconductor such as Si, SiC, Ge or the like, a single metal substrate and a metal substrate made of a complex of two or more metals. Among them, one having electric conductivity is preferable. Further, in view of mechanical strength, elastic deformation, plastic deformation, resistant to break, heat dissipation characteristics, or the like, a metal substrate is preferable. Also, one having a high thermal conductivity is preferable. A Si substrate is preferable because it is inexpensive and easy to process. The thickness of the supporting substrate is suitably, for example, about 50 to 500 μm.

A joining layer is preferably formed between the supporting substrate and the stacked layer body, particularly, on the surface of the supporting substrate, to reduce resistance in joining. The joining layer can be formed by using the same material as the first electrode which is formed on the first Bragg reflector.

Joining can be carried out by employing a method which is generally used in the art, for example, a method in which the joining surfaces are put together and held at a predetermined temperature and pressure so as to be bonded. Also, the method of forming the supporting substrate is not particularly limited and a known method which is generally used in the art can be employed. Examples thereof include a thermal compression bonding method, a direct bonding method, an electrolytic plating method, or the like.

Then, the substrate used for growing the stacked layer body is removed from the stacked layer body and the second conductive-type layer is exposed. In the steps to be taken afterward, the processing is carried out with the second conductive-type layer side being upward. Herein, a method for removing the substrate is not particularly limited, and any known method in the art can be employed. For example, laser lift-off method, polishing, etching or the like, can be employed. The exposed surface of the second conductive-type layer is preferably processed by employing, for example, a CMP (chemical mechanical polishing) method, a CMP method using suitable polishing agent, an etching method using a suitable etchant. A method for processing the surface of the second conductive-type layer is not particularly limited and any known method in the art can be employed.

Polishing/etching to obtain a mirror surface can be realized by, particularly as described above, disposing an etching stopping layer in the second conductive-type layer to terminate the etching. Thus, both the smooth surface and precise control of the cavity length can be achieved. In this case, etching can be performed on the entire surface or on a part which includes the element region.

Also, herein, the total film thickness of the stacked layer body which is left after the polishing/etching for obtaining a mirror surface is the length of the resonator of the nitride semiconductor light emitting element. The deviation of the resonator length may largely affect the laser properties. Therefore, precise control of the remaining total thickness is significantly important. A reduction of the resonator length contributes a reduction of optical loss and an improvement in stability of longitudinal mode, but in view of current injection, the resistance and heat generation increase. Therefore, it is preferable that the remaining thickness of the stacked layer body to be appropriately adjusted. Generally, the mirror surface is formed so that the total film thickness of the remaining stacked layer body is about 0.3 to 6.0 µm. As described above, with the mirror finishing, scattering of light at the second conductive-type layer can be minimized.

The stacked layer body formed in a wafer state is preferably divided into individual element state, before forming the after-described second electrode and/or the second Bragg reflector, or at other suitable steps, for example, after removing the substrate from the stacked layer body, or after making the surface of the second conductive-type layer into a mirror surface, or the like.

As described above, in a case where the region to be divided into individual elements is already made into a protruded shape in the stacked layer body, it is suitable that the dividing is carried out to the depth reaching the upper surface of the protrusion. In a case where the protrusion is not formed, it is suitable that the dividing is carried out at least into the entire depth along the film thickness direction of the stacked layer body. Alternatively to the dividing, the stacked layer body may be processed into a protrusion shape. This processing can be carried out to the same depth as the dividing. With this protrusion processing, the effect according to the protrusion shape described above can be enhanced, thus, further contribution to lateral confinement of light can be achieved.

Also, as in the above-described formation of the insulating film and the metal film on the side surfaces of the stacked layer body and the protrusion (side surfaces of the first conductive-type layer and the light emitting layer), the insulating film and the metal film can be formed in this order on the side surface of the stacked layer body which have been divided. With this, heat dissipation characteristics can be further improved and stable oscillation can be achieved.

Figure 13A:
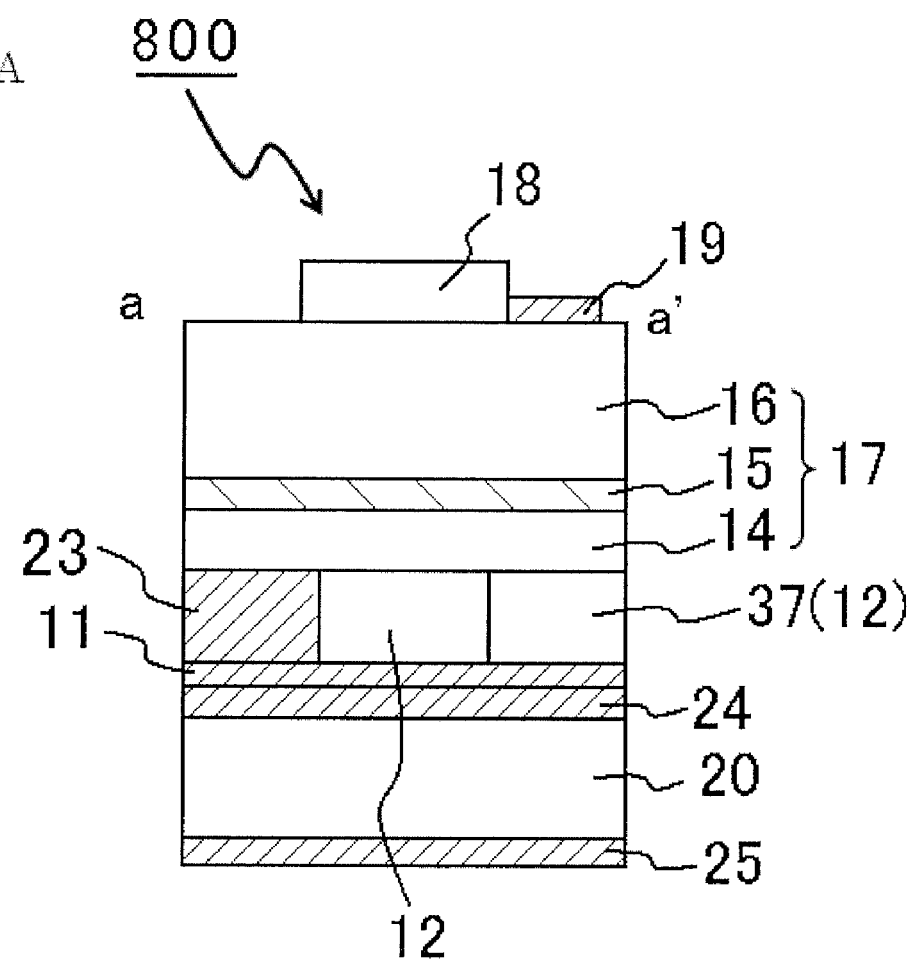
FIG. 13A is a schematic cross-sectional view and FIG. 13B is a schematic plan view of a structure of a nitride semiconductor light emitting element according to yet another embodiment of the present invention.
Figure 13B:
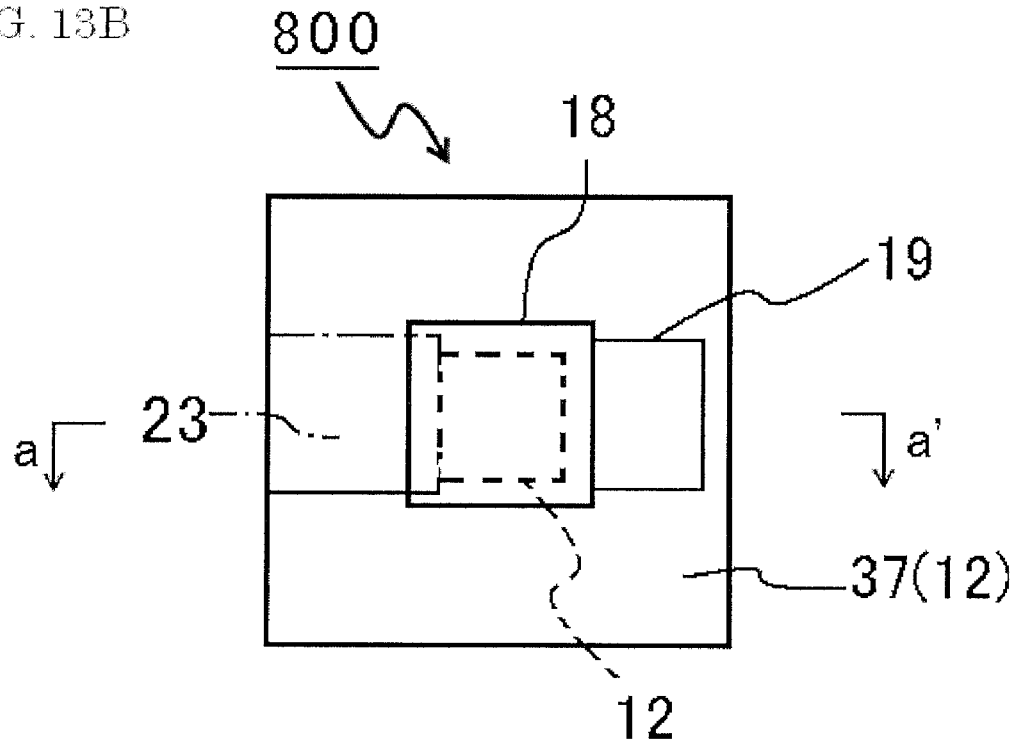
Figure 14:
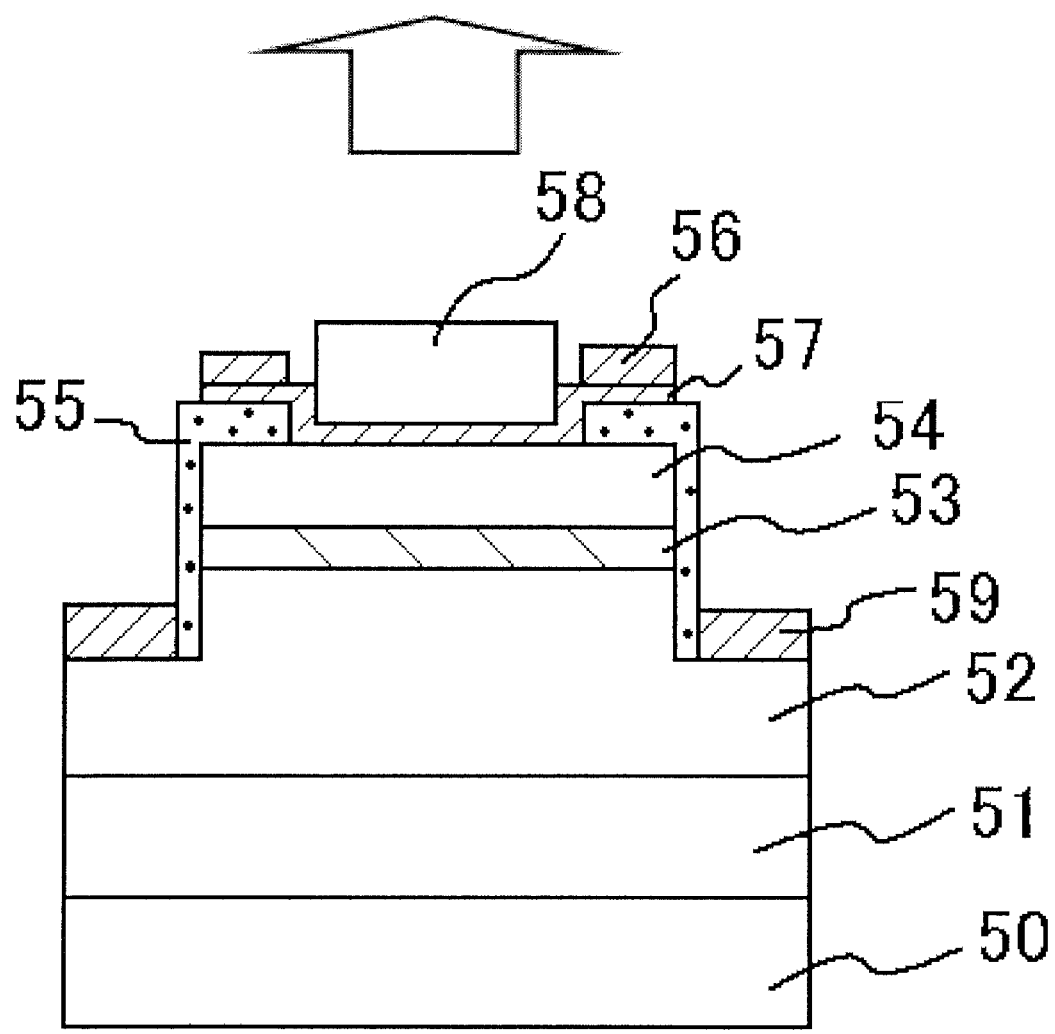
FIG. 14 is a schematic cross-sectional view showing a structure of a conventional nitride semiconductor light emitting element.

Next, the second electrode and the second Bragg reflector are disposed in an appropriate order on the second conductive-type layer. The second electrode can be formed on any position with any contact area, as long as it can supply electric current to the second conductive-type layer. For example, the second electrode may be disposed in a shape either intact or divided, on a surface of the second conductive-type layer which locates outside of the region facing the portion where the first conductive-type layer and the first transparent electrode are directly in contact with each other, as described above. Particularly, the second electrode is preferably disposed in an annular shape so as to surround the portion where the first conductive-type layer and the first transparent electrode are directly in contact with each other. Also, the second electrode may be formed on the second Bragg reflector and/or between the second conductive-type layer and the second Bragg reflector so as to overlap the periphery of the second Bragg reflector. Also, as shown in FIGS. 13A and 13B, the second electrode 19 may be disposed on the surface of the second conductive-type layer at a diagonally opposite corner to the region where the connecting electrode 23 and the first conductive-type layer 14 are in contact each other in cross-sectional view. With the diagonal position, electric current can be laterally spread. Therefore, the amount of electric current supplied to the element region can be increased and a light emitting element of high efficiency can be obtained. The contact area of the second electrode and the second conductive-type layer can be adjusted appropriately by the material, the size of the nitride semiconductor light emitting element, or the like.

The second electrode can be disposed in the same manner as the connecting electrode. Also, the second electrode may be formed on the second Bragg reflector or between the second conductive-type layer and the second Bragg reflector, or formed interposed between the multilayer films so as to overlap the periphery of the element region. With this arrangement, the threshold for the high-order lateral mode becomes higher than that of the fundamental lateral mode, and the oscillation in a higher-order mode is suppressed. Thus, output power in fundamental mode can be increased. The second electrode can be formed with a same material used for the first electrode. Among them, one having a low resistance is preferable. Examples thereof include electrode materials of, such as, Ni—Au system, Ni—Au—Pt system, Pd—Pt system, Ni—Pt system, Ti—Pt—Au system, Ti—Al—Au system.

The second Bragg reflector can be formed with a same material, shape, and size, and in the same manner as in the first Bragg reflector. Herein, the first and second Bragg reflectors are not needed to be made by the same material nor with the same structure. In order to obtain a desired reflectance, the material, the film thickness, the number of multilayer film pairs can be appropriately adjusted. The second Bragg reflector is needed to be disposed in the region opposite to the first Bragg reflector and to cover the region where electric current is supplied to the light emitting layer.

Also, it is preferable that the second Bragg reflector is disposed with a larger area than the first Bragg reflector, and to cover the region opposite to the first Bragg reflector. By forming the second Bragg reflector as described above, the first and second Bragg reflectors can be disposed opposite to each other, and a nitride semiconductor light emitting element of high efficiency can be manufactured easily with good reproducibility.

In addition, before forming the second Bragg reflector, a second transparent electrode may be formed between the second conductive-type layer and the second Bragg reflector. The second transparent electrode is disposed to be electrically connected to the second electrode, such that an insulating layer having an aperture in the element region on the second conductive-type layer is formed and the second transparent electrode is formed on it. With this arrangement, current distribution can be improved. The second transparent electrode can be formed with a same material and in the same manner as in the first transparent electrode. Herein, the first and second transparent electrodes are not needed to be made by the same material, the same structure nor the same shape.

As described above, in a case where an insulating film and a metal film are disposed on the side surface of the stacked layer body, the second electrode and the second transparent electrode are preferably disposed insulated from the metal film on the side surface of the stacked layer body. This is desirable, in order to supply electric current appropriately to the second conductive-type layer and to prevent occurrence of short circuit or the like.

The nitride semiconductor light emitting element of the present invention can be manufactured by using the methods described above or by using other methods. An embodiment of such a nitride semiconductor light emitting element includes, above a supporting substrate stacked in the order are, a first Bragg reflector made of a dielectric multilayer film, a stacked layer body of a nitride semiconductor in which a first conductive layer, a light emitting layer, and a second conductive-type layer are stacked in this order, and a second Bragg reflector made of a dielectric multilayer film and disposed so as to face the first Bragg reflector, and a first electrode electrically connected to the first conductive-type layer and the supporting substrate, and further, the first electrode is disposed between the supporting substrate and the first Bragg reflector. With this arrangement, the reflectance of the first Bragg reflector can be improved. Accordingly, the number of layers in the dielectric multilayer film can be reduced and heat dissipation characteristics can be improved.

As described above, the first electrode and the second electrode can be disposed facing to each other via the semiconductor layer, so that unevenness in electric current distribution can be improved. With this, heat generation in the element can be suppressed. Further, combined with utilizing the first transparent electrode, distribution of lateral light and gain can be adjusted. As a result, efficient emission and/or oscillation can be realized.

Further, the first Bragg reflector and the second Bragg reflector can be made with a dielectric multilayer film capable of obtaining very high reflectance, and a high quality nitride semiconductor layer can be arranged between the reflectors, so that effective light emitting and/or oscillation can be realized. In addition, by using a supporting substrate having high thermal conductivity, heat generated in the element can be effectively released. Particularly, in a case where the side surface of the protrusion is covered with an insulating film and a metal film, the heat dissipation characteristics can be further improved, so that a nitride semiconductor light emitting element of high quality can be obtained.

In the semiconductor laser element of the present invention, light is preferably extracted from the second Bragg reflector side.

In the semiconductor laser element of the present invention, the Bragg reflectors can be provided with a desired size, so that various element designs as described below can be realized.

The second Bragg reflector is preferably disposed to cover the region facing the first Bragg reflector. That is, it is preferable that the area of the first Bragg reflector which is at the light reflecting side is smaller than the area of the second Bragg reflector which is at the light emitting side. In other words, in the cross sectional view, the width of the first Bragg reflector is smaller than that of the second Bragg reflector. With this arrangement, heat generated near the light emitting layer can reach the first electrode in a shorter distance, so that the heat can be released effectively to the supporting substrate side.

In the semiconductor laser element of the present invention, an insulating layer is provided at the first conductive-type layer side to confine electric current, and a larger area can be assigned to the second Bragg reflector which is at the light emitting side than that to the first Bragg reflector.

The nitride semiconductor light emitting element and the method of manufacturing the same according to the present invention will be described in detail below with reference to Figures.

Embodiment 1

The nitride semiconductor light emitting element 100 of the present embodiment is constituted such that, as shown in FIG. 1, on the silicon substrate as the supporting substrate 20, a joining layer 24, a first electrode 11, a first Bragg reflector 12 made of a dielectric multilayer film, a first transparent electrode 13 made of ITO, a stacked layer body 17 of a nitride semiconductor, and a second Bragg reflector 18 made of a dielectric multilayer film, stacked in this order. Also, a connecting electrode 23 which is electrically connected to both the first electrode 11 and the first transparent electrode is formed on a side surface of the first Bragg reflector 12.

Further, a second electrode 19 which is electrically connected to the upper surface of the stacked layer body 17 is formed in the periphery of the second Bragg reflector 18. An insulating layer 22 made of $SiO_2$ is disposed in the periphery of the element and between the first transparent electrode 13 and the stacked layer body 17 and defines the element region. A back surface electrode 25 is formed on the entire back surface of the supporting substrate 20.

In the nitride semiconductor light emitting element 100, the back surface electrode 25 is formed with $TiSi_2$/Pt/Au (film thickness: 3 nm/250 nm/500 nm) in this order from the supporting substrate 20 side. The joining layer 24 is formed with $TiSi_2$/Pt/Pd (film thickness: 3 nm/250 nm/350 nm) in this order from the supporting substrate 20 side. The first electrode 11 is formed with Ti/Pt/Au/Sn/Au (film thickness: 100 nm/300 nm/300 nm/3000 nm/100 nm) in this order from the stacked layer body side. The second electrode is formed with Ti/Pt/Au/Ni (film thickness: 17 nm/200 nm/500 nm/6 nm) in this order from the stacked layer body side.

The stacked layer body 17 of the nitride semiconductor is constituted with the layers stacked from the supporting substrate 20 side in the order of a first conductive-type layer (hereinafter may be described as "p-type layer") 14, a light emitting layer 15, a second conductive-type layer (hereinafter may be described as "n-type layer") 16, with a film thickness of 70 nm, 60 nm, and 1000 nm, respectively. Accordingly, the resonator length (C in FIG. 1) is 1130 nm.

The first Bragg reflector 12 is a film in which $Nb_2O_5$ (film thickness: 40 nm) and $SiO_2$ (film thickness: 70 nm) are stacked in this order from the stacked layer body 17 side. The number of stacked layer is 12 pairs and the thickness of the first layer $Nb_2O_5$ is made thinner than $\lambda/4n$ to adjust the phase of the standing wave.

The second Bragg reflector 18 is a film in which $SiO_2$ (film thickness: 70 nm) and $Nb_2O_5$ (film thickness: 40 nm) are stacked in this order from the supporting substrate 20 side, and the number of stacked layer is 7 pairs. In the nitride semiconductor light emitting element 100, the diameter of the element region (M in FIG. 1) is 8 μm.

Figure 2A:
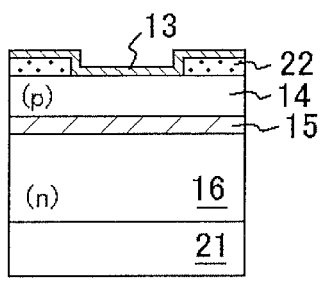
FIG. 2A-2I are schematic cross-sectional views illustrating a process flow of a method of manufacturing a nitride semiconductor light emitting element shown in FIG. 1.

The nitride semiconductor light emitting element with the structure as described above can be manufactured by a method described below. First, as shown in FIG. 2A, a sapphire substrate was prepared as a growth substrate 21 of the semiconductor. On the sapphire substrate, as an underlayer, a buffer layer of AlGaN of 10 nm and a buffer layer of undoped GaN of 1.5 μm were stacked.

Thereon, as the second conductive-type layer 16, a Si doped GaN was grown to a film thickness of 2 μm.

Next, a barrier layer made of Si doped $In_{0.02}Ga_{0.98}N$ was grown to a film thickness of 13 nm, and a well layer made of undoped $In_{0.10}Ga_{0.90}N$ was grown to a film thickness of 10 nm. The barrier layer and the well layer were alternately stacked twice and finally, a barrier layer made of undoped $In_{0.02}Ga_{0.98}N$ was grown to a film thickness of 13 nm to form the light emitting layer 15 having a multiquantum well structure (MQW) of total film thickness of 59 nm.

Next, as the first conductive-type layer 14, a Mg doped p-type $Al_{0.33}Ga_{0.67}N$ was grown to a film thickness of 7.5 nm, and a contact layer made of a Mg doped p-type GaN was grown to a film thickness of 63 nm.

The film thickness of the light emitting layer 15 and the first conductive-type layer 14 are respectively adjusted so that the light emitting layer 15 was placed at the anti-node of a standing wave and the first transparent electrode which will be described later was placed at the node of the standing wave.

Next, an insulating layer 22 made of $SiO_2$ was formed on the first conductive-type layer 14 to a film thickness of about 50 nm and then patterned to form a shape having a circular aperture with a diameter of 8 μm in the central portion thereof (FIG. 2A).

Next, a first transparent electrode 13 made of ITO with a film thickness of about 50 nm was formed on the patterned insulating layer 22 (FIG. 2A). With this arrangement, the first conductive-type layer 14 and the first transparent electrode 13 are directly in contact with each other at the aperture of the insulating layer 22, so that the element region can be formed.

Next, a thermal treatment was performed to obtain an ohmic contact.

Figure 2B:
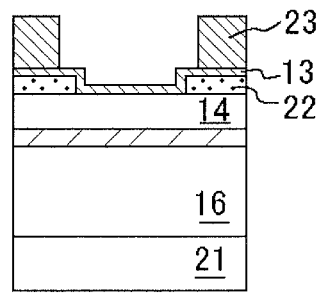

Then, the region where the first conductive-type layer 14 and the first transparent electrode 13 are directly in contact with each other (element region) was covered with a resist by photolithography, and a film of connecting electrode 23 made of Ti/Rh/Au was formed, and then lift off step was performed to form the connecting electrodes 23 on a part of the first transparent electrode 13 which is not in contact with the first conductive-type layer 14 (FIG. 2B). The connecting electrode 23 was formed with a thickness corresponding to the thickness of the first Bragg reflector 12 which will be described later, for example, 1.3 μm.

Figure 2C:
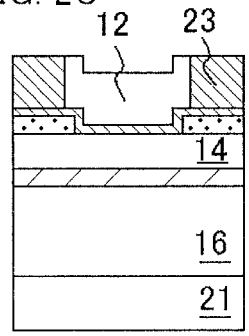

Next, as shown in FIG. 2C, the first Bragg reflector 12 was formed in a circular shape of 18 μm in diameter, on a region (element region) where the first transparent electrode 13 is in contact with the first conductive-type layer 14 and on the insulating layer. In this embodiment, in order to minimize the light loss due to absorption by the first transparent electrode 13 and to improve the coupling of light and gain, the first layer of a dielectric layer ($Nb_2O_5$) was formed to a thickness of 20 nm so that the first transparent electrode 13 was placed at the node of the standing wave and the light emitting layer 15 was placed at the anti-node of the standing wave.

Figure 2D:
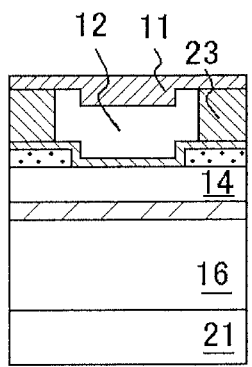

As shown in FIG. 2D, the first electrode 11 was formed on the first Bragg reflector 12 and the connecting electrode 23 obtained above.

Figure 2E:
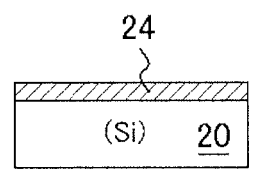

Meanwhile, as shown in FIG. 2E, independently from the above, a silicon substrate was prepared as a supporting substrate 20 having a joining layer 24 formed thereon.

Figure 2F:
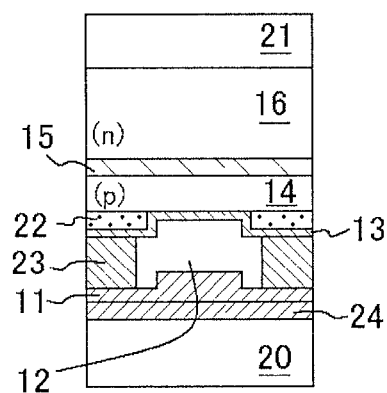

As shown in FIG. 2F, the joining layer 24 of the silicon substrate was bonded to the first electrode 11 side of the growth substrate 21 obtained above. Then, the growth substrate 21 was removed by laser assist epitaxial lift off to expose the surface of the second conductive-type layer 16.

Figure 2G:
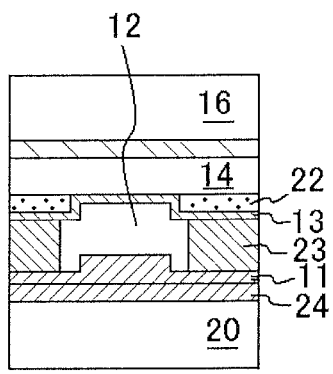

As shown in FIG. 2G, the exposed surface of the second conductive-type layer was polished by using CMP method so as to minimize scattering of light. The whole film thickness of the stacked layer body 17 was adjusted to about 1.1 μm by the polishing.

Figure 2H:
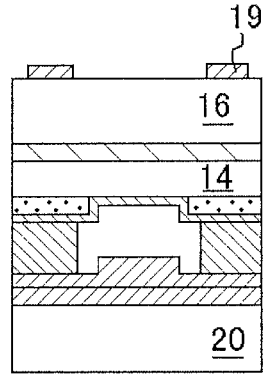

Next, as shown in FIG. 2H, the second electrode 19 was formed on the second conductive-type layer 16 in a desired shape. In this embodiment, the second electrode 19 was formed in the region which does not correspond to the element region. That is, the second electrode was formed in a shape with an aperture of 28 μm in diameter with the element region at the center.

Figure 2I:
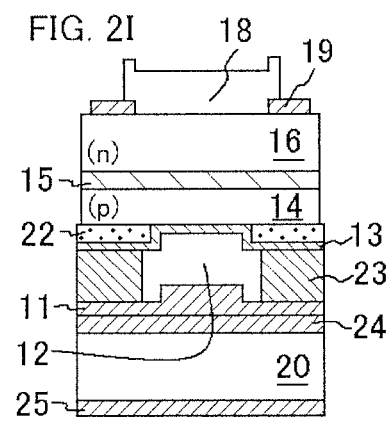

Then, as shown in FIG. 2I, the second Bragg reflector 18 of a circular shape 48 μm in diameter and made of a dielectric multilayer film was formed on the second conductive-type layer 16 to cover the element region. Next, the back surface electrode 25 was formed on the whole back surface of the supporting substrate 20. Finally, the stacked layer body in the region for dicing was removed and the nitride semiconductor light emitting element was divided into individual chips by dicing.

With this, the laser element (nitride semiconductor light emitting element 100) with the stacked layer body 17 of the nitride semiconductor layer formed above the supporting substrate 20 and having a resonator in the perpendicular direction can be obtained.

Figure 3:
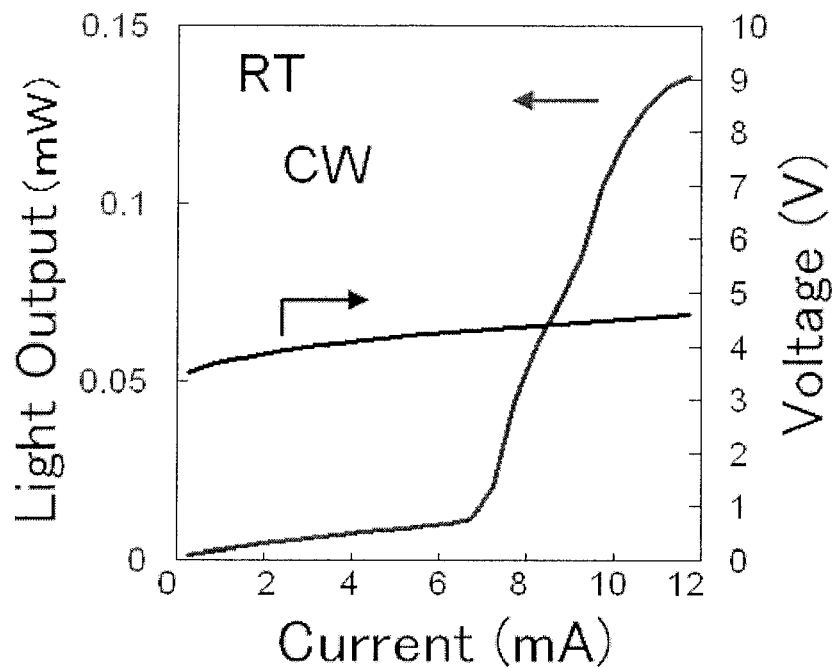
FIG. 3 is a graph showing the current-light output and the current-voltage characteristics of a nitride semiconductor light emitting element shown in FIG. 1.

To obtain continuous-wave operation, electric current was applied at room temperature to the nitride semiconductor light emitting element 100 fabricated as described above, and a laser light was emitted in the direction of arrow in FIG. 1. The current-light output characteristic and the current-voltage characteristic under continuous-wave operation are shown in FIG. 3. As shown in FIG. 3, the nitride semiconductor light emitting element had a threshold current of 7.0 mA, a threshold voltage of 4.3 V, and output power of about 0.14 mW at 12 mA. The threshold current density is 13.9 $kA/cm^2$ with assumption that the electric current has been spread over the whole current injection portion.

Figure 4:
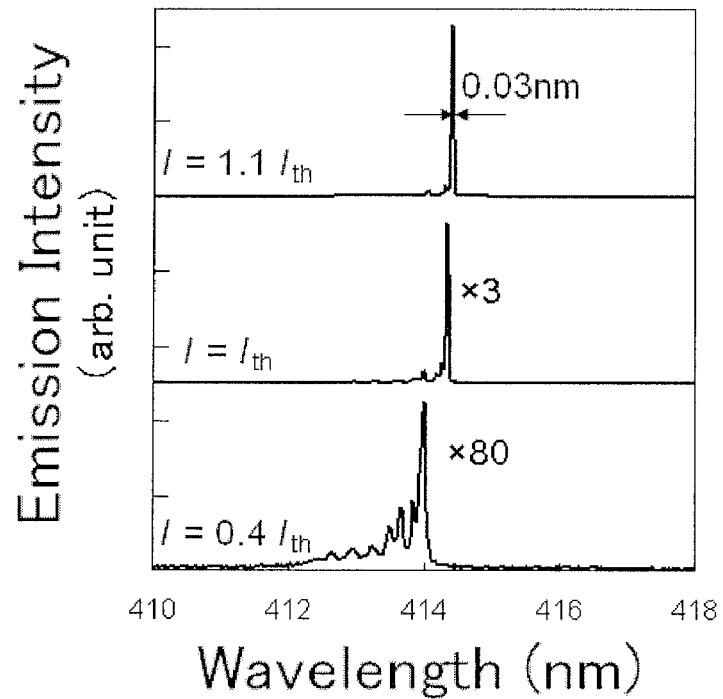
FIG. 4 is a graph showing the wavelength-emission intensity characteristics of a nitride semiconductor light emitting element shown in FIG. 1.
Figure 5A:
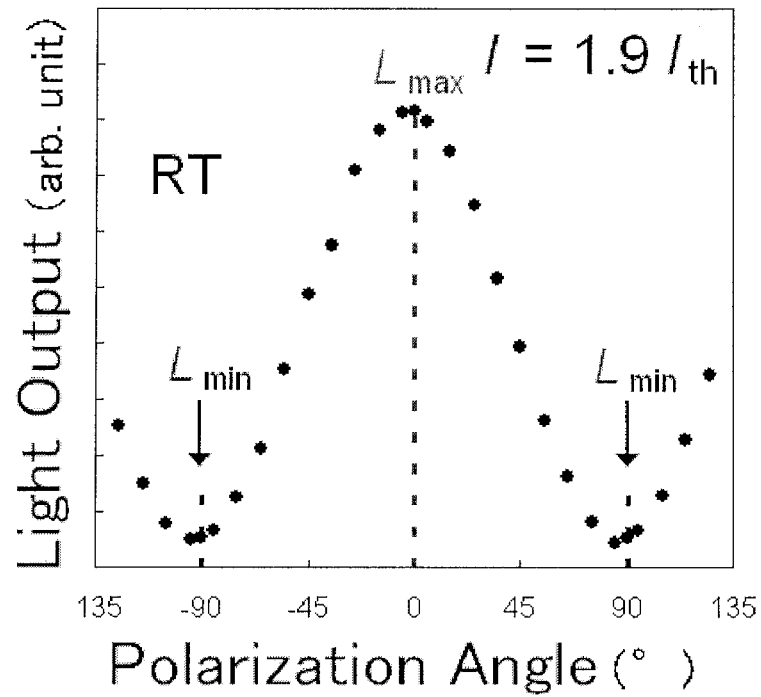
FIG. 5A is a graph showing the polarization characteristics of a nitride semiconductor light emitting element shown in FIG. 1.
Figure 5B:
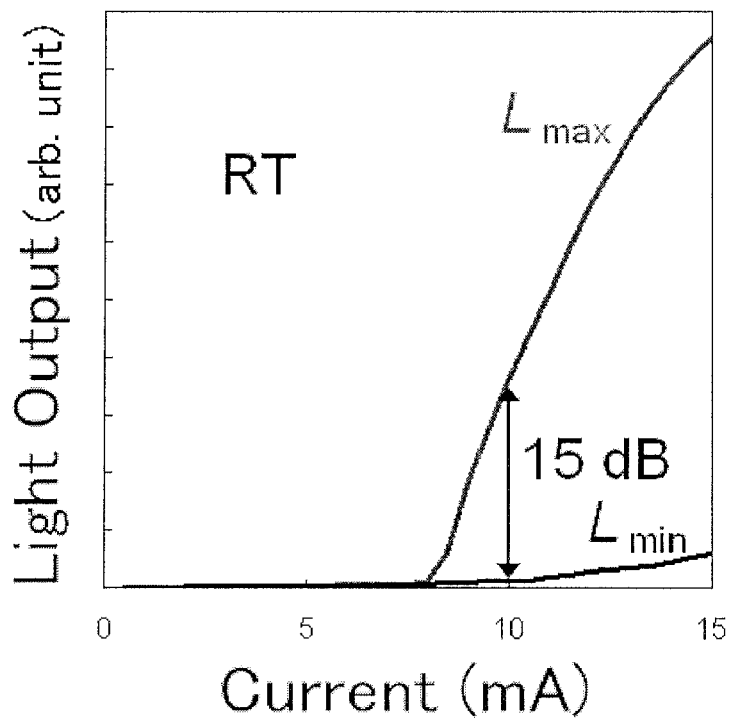
FIG. 5B is a graph showing the polarization-resolved current-light output characteristics of a nitride semiconductor light emitting element shown in FIG. 1.

As shown in FIG. 4, according to the spectra below and above the threshold, the oscillation wavelength was about 414 nm, and immediately after the oscillation, the full width at half maximum was 0.03 nm which is the limit of resolution. Also, from the near-field image, oscillation from a part of the current injection region was observed. Further, in a pulse-mode operation (pulse width 1 μsec, 0.1%), the polarization property of this vertical cavity surface emitting laser was such that, as shown in FIGS. 5A and 5B, a linear polarization was observed with a maximum extinction ratio of 15 dB.

As described above, with the nitride semiconductor light emitting element of the present embodiment, continuous-wave oscillation at room temperature by vertical cavity surface emitting laser of nitride semiconductor system, which has not been realized until now, is accomplished. Employing the element structure and method of manufacturing thereof described above, matching of lateral distribution of light and gain is improved and effects such as improvement in heat release property are effectively exerted. As described above, according to the method of manufacturing the nitride semiconductor light emitting element of the present embodiment, the first electrode is disposed between the supporting substrate and the first Bragg reflector, and the Bragg reflector made of a dielectric multilayer film and the electrode are formed at the both sides of the stacked layer body. Accordingly, uniformity of current distribution can be improved and heat dissipation characteristics of the element can be improved, so that a nitride semiconductor light emitting element of high efficiency can be manufactured.

Embodiment 2

Figure 6:
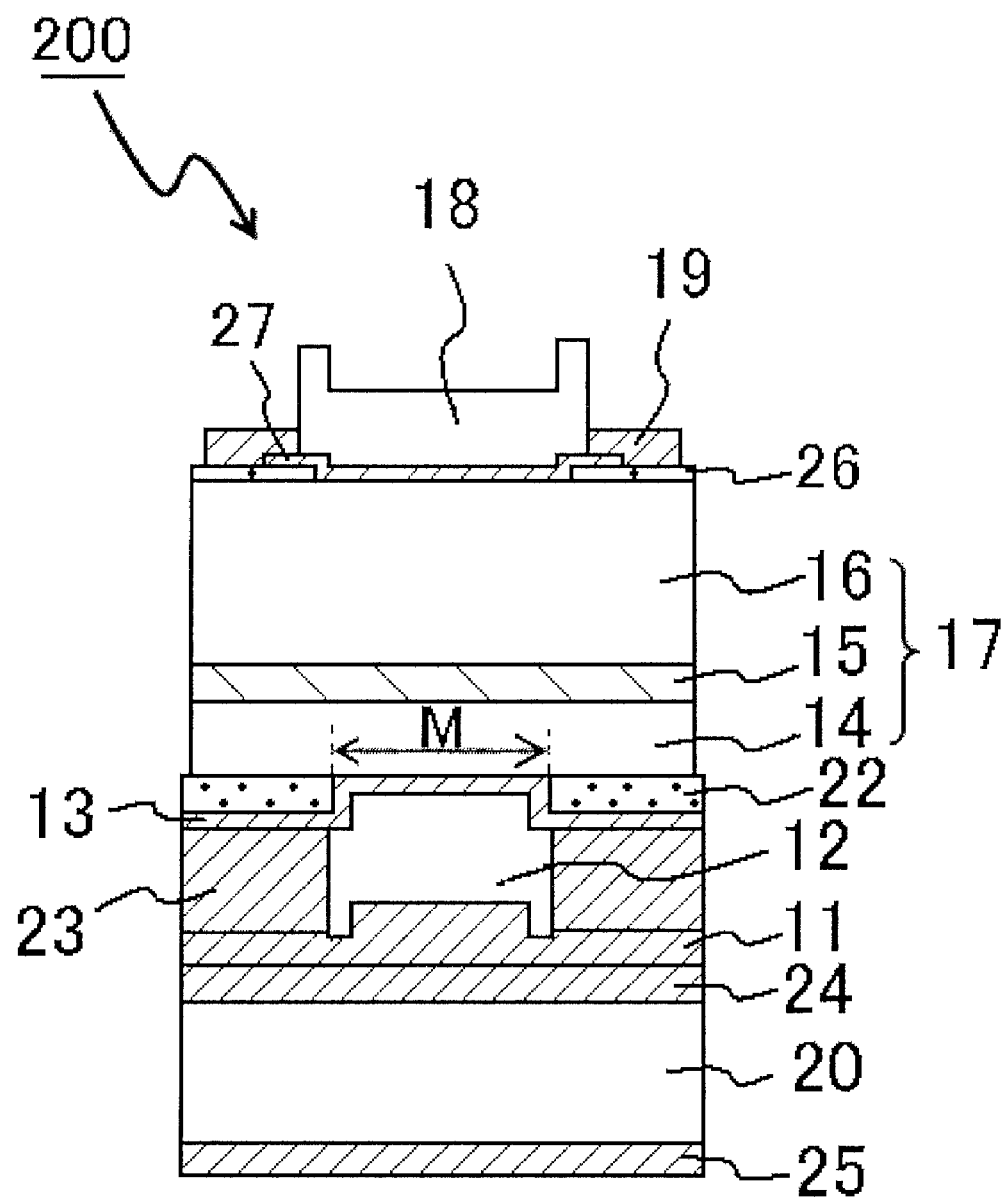
FIG. 6 is a schematic cross-sectional view of a structure according to another embodiment of a nitride semiconductor light emitting element of the present invention.

As shown in FIG. 6, the nitride semiconductor light emitting element 200 of the present embodiment, the second transparent electrode 27 is disposed in the central portion over the second conductive-type layer 16 via the insulating layer 26. The second Bragg reflector 18 is formed right on the second transparent electrode 27. The structure of the nitride semiconductor light emitting element 200 is substantially the same as that in Embodiment 1 except the portions described above. With such a structure, in which the transparent electrodes are disposed to the both sides (over, or below or under) of the stacked layer body, in addition to the effect described in Embodiment 1, the electric current which tends to crowd at the periphery of the element region can be well dispersed into the central portion. Thus, lateral distribution of light and gain can be well matched and laser oscillation characteristics can be improved. The present embodiment is particularly advantageous particularly in a case where the remaining thickness of the stacked layer body 17 in polishing step is reduced, because the electric current is more likely to concentrate in the outside portions.

Embodiment 3

Figure 7:
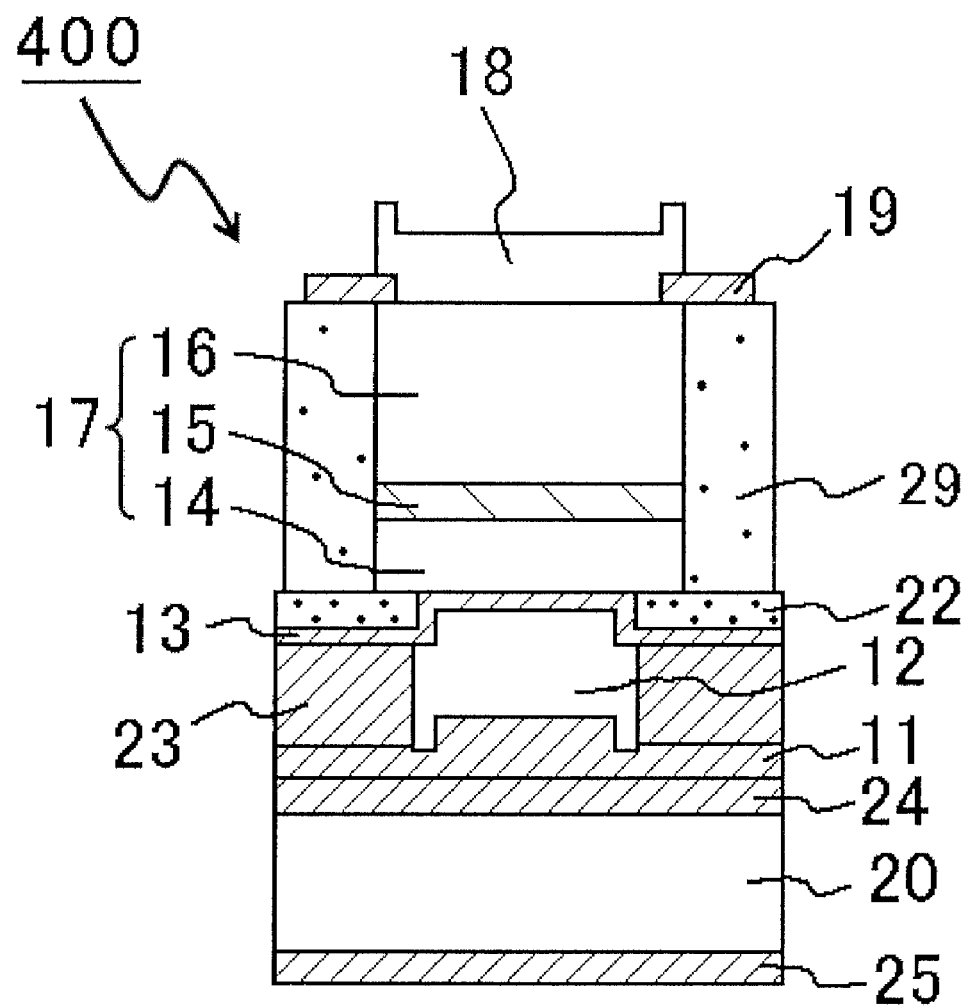
FIG. 7 is a schematic cross-sectional view of a structure of yet another embodiment of a nitride semiconductor light emitting element of the present invention.

As shown in FIG. 7, the nitride semiconductor light emitting element 400 of the present embodiment has a stacked layer body 17 processed into a cylinder shape by etching the first conductive-type layer 14, the light emitting layer 15 and the second conductive-type layer 16 in the film thickness direction. Also, the entire side surface of the cylinder is covered with an insulating film 29 made of $SiO_2$. The structure of the nitride semiconductor light emitting element 400 is substantially the same as that in Embodiment 1 except the portions described above. With such a structure, lateral light can be more strongly confined than in Embodiment 1.

Embodiment 4

As shown in FIG. 8, the nitride semiconductor light emitting element 300 of the present embodiment has a stacked layer body 17 processed into a protrusion shape by etching the first conductive-type layer 14, the light emitting layer 15 and a portion of the second conductive-type layer 16 in the film thickness direction. Also, the side surface of the protrusion is covered with an insulating film 28 made of $SiO_2$ having a refractive index lower than that of GaN. Further, a part of the second conductive-type layer 16 is etched so that the width thereof is larger than the width of the protrusion and smaller than the width of the connecting electrode 23. That is, the stacked layer body 17 has a protrusion shape at the first conductive-type layer 14 side and the width of the second conductive-type layer 16 side is smaller than those of the supporting substrate 20 and the connecting electrode 23. The structure of the nitride semiconductor light emitting element 300 is substantially the same as that in Embodiment 1 except the portions described above. With such a structure, in addition to the effect described in Embodiment 1, light can be strongly confined in the lateral direction. Moreover, the carriers from the second conductive-type layer (n-type layer) 16 can be constricted, so that electric current can be effectively injected into the light emitting layer 15.

Embodiment 5

As shown in FIG. 9, the nitride semiconductor light emitting element 600 of the present embodiment has a connecting electrode 43, for ensuring the electric connection between the transparent electrode 13 and the supporting substrate 20 (the first electrode 11), disposed at the outside of the element region and penetrating through the dielectric multilayer film constituting the first Bragg reflector 12. The structure of the nitride semiconductor light emitting element 600 is substantially the same as that in Embodiment 1 except the portions described above. With such a structure, in addition to the effect described in Embodiment 1, burr generation of the metal originated from the connecting electrode by dicing can be prevented.

Embodiment 6

As shown in FIG. 10, the nitride semiconductor light emitting element 500 of the present embodiment has a protrusion shape formed by etching the first conductive-type layer 14, the light emitting layer 15 and a portion of the second conductive-type layer 16 in the film thickness direction.

Also, the side surface of the protruding shape is covered with the insulating layer 22 made of $SiO_2$ and the periphery of the insulating film 22 is covered with a metal film 23 made of Ti/Rh/Au.

With such a structure, in addition to the effect described in Embodiment 3, heat generated in the stacked layer body can be effectively released to the supporting substrate through the metal disposed adjacent to the side surface of the protrusion, and heat dissipation characteristics of the element can be improved. Moreover, by forming the metal film on the side surface of the protrusion, the step difference due to the protrusion can be reduced and bonding between the stacked layer body and the supporting substrate can be enhanced, thus enables the manufacturing with good reproducibility.

Figure 11A:
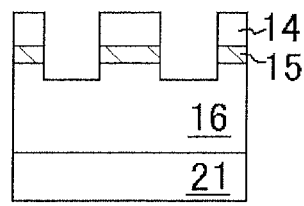
FIG. 11A-11G are schematic cross-sectional views illustrating a process flow of a method of manufacturing a nitride semiconductor light emitting element shown in FIG. 10.

The nitride semiconductor light emitting element described above can be manufactured according to a method below. As shown in FIG. 11A, as in the same manner in Embodiment 1, on a substrate 21 (growth substrate), a second conductive-type layer 16, a light emitting layer 15, and a first conductive-type layer 14 are formed. Then, from the first conductive-type layer 14 side, the first conductive-type layer 14, the light emitting layer 15, and a portion of the second conductive-type layer 16 are etched to form a protrusion structure with a cylinder shape having a diameter of 20 μm.

Figure 11B:
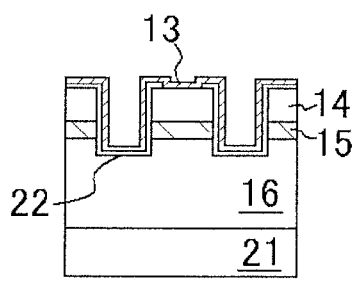
Figure 11C:
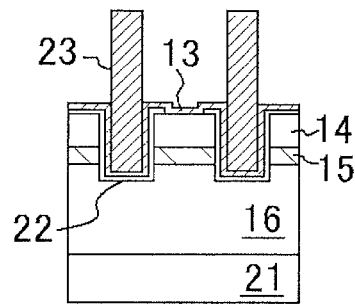

As shown in FIG. 11B, an insulating layer 22 is applied to the surfaces of the semiconductor layer except the element region including the side surface of the protrusion. Then, a first transparent electrode 13 is formed on the surfaces of the semiconductor layer including the insulating layer 22 obtained as above. As shown in FIG. 11C, an annular metal film 23 which also serves as a connecting electrode is formed in the periphery of the protrusion which is on the first transparent electrode 13 and where an insulating layer 22 is disposed directly below thereof.

Figure 11D:
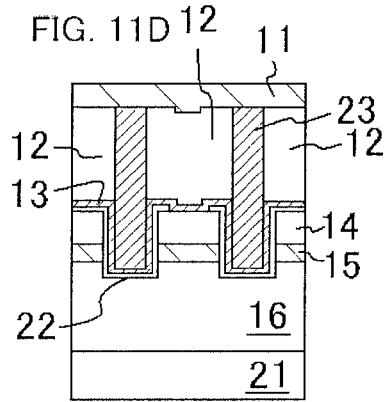

Then, as shown in FIG. 11D, a first Bragg reflector 12 is formed to be the same height as the metal layer 23, and a first electrode 11 is formed thereon.

Figure 11E:
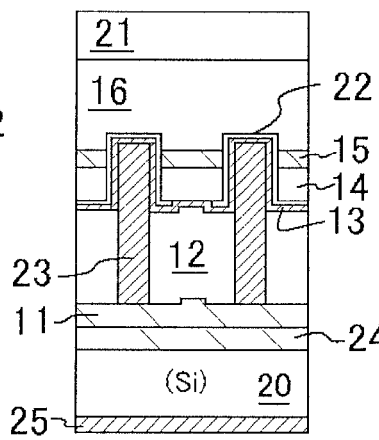
Figure 11F:
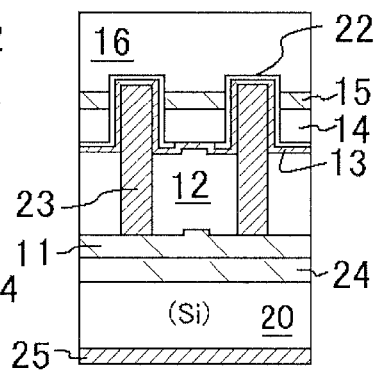

As shown in FIG. 11E, as in the Embodiment 1, the obtained stacked layer body 17 is bonded to the supporting substrate 20, and as shown in FIG. 11F, the substrate 21 is removed and a mirror surface is made in the second conductive-type layer 16.

Figure 11G:
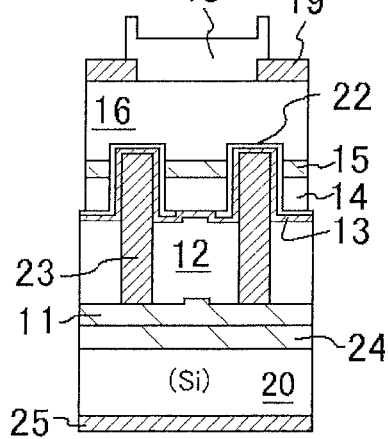

As shown in FIG. 11G, as in Embodiment 1, a second electrode 19 and a second Bragg reflector 18 are formed on the second conductive-type layer 16. Next, a back surface electrode 25 was formed on the entire back surface of the supporting substrate 20. Finally, the stacked layer body in the region where dicing is to be carried out is removed and the nitride semiconductor light emitting element is divided into individual chips by dicing. Thus, a nitride semiconductor light emitting element 500 shown in FIG. 10 can be obtained.

Embodiment 7

As shown in FIG. 12, in the nitride semiconductor light emitting element 700 of the present embodiment, an etching stopping layer 36 is formed between the second conductive-type layers 16a and 16b, a part of the second conductive-type layer is removed, and the film thickness of the second conductive-type layer where a second Bragg reflector to be formed is reduced compared with the other region. The structure of the nitride semiconductor light emitting element 700 is substantially the same as that in Embodiment 1 except the portions described above. Specifically, after forming 1.5 μm of the second conductive-type layer 16b, 50 nm of the etching stopping layer 36 of AlGaN is formed. Then, 0.5 µm of the second conductive-type layer 16a is formed. Further, after removing the growth substrate (not shown), a part of the second conductive-type layer 16b on which the second Bragg reflector to be formed is etched until the etching stopping layer is exposed.

The nitride semiconductor light emitting element 700 can be formed substantially in the same manner as in Embodiment 1 except the portions described above. Such a structure enables not only oscillation at a desired wavelength, due to the reduction in the length of the resonator compared to that in the element of Embodiment 1, it also enables a reduction of optical loss and improvement in stability of longitudinal mode. Moreover, the portions where the electrodes to be formed are left thick, so that impurity can be added to the second conductive-type layer 16b at a high concentration. Thus, resistance can be reduced and unevenness of the electric current can be improved, and a light emitting element of high efficiency can be obtained.

Embodiment 8

As shown in FIG. 13, in the nitride semiconductor light emitting element 800 of the present embodiment, a first conductive-type layer 14 is stacked on the first Bragg reflector 12 and the first electrode 11, and the second electrode 19 is disposed diagonally to the connecting electrode 23 with interposing the element region. The structure of the nitride semiconductor light emitting element 800 is substantially the same as that in Embodiment 1 except the portions described above.

Specifically, in the step of forming the connecting electrode 23, on the first conductive-type layer 14, in top view, the connecting electrode 23 is formed at only one side of the element region and the insulating layer 37 or the first Bragg reflector 12 is formed at the other side. Further, in the step of forming the second electrode 19, the second electrode 19 is formed on the surface of the second conductive-type layer 16 at the other side (above the region where the insulating layer 37 or the first Bragg reflector 12 is formed) of the element region. With such a structure, the electric current can be spread in lateral direction in the first conductive-type layer 11 having a high resistance. Therefore, a larger amount of electric current can be supplied to the element region and the gain can be increased.

Embodiment 9

In the nitride semiconductor light emitting element of the present embodiment, a tunnel junction layer is stacked between the first Bragg reflector and the first conductive-type layer, and an insulating region is formed near the active layer by ion implantation or thermal oxidation, or the like. The structure is substantially the same as that in Embodiment 1 except the portions described above. With such a structure, the electric current can be spread in lateral direction at the tunnel junction layer, and with the insulating region, the electric current can be prevented from concentrating only in the portion directly below the electrodes.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A nitride semiconductor light emitting element comprising:
    a supporting substrate;
    a first Bragg reflector made of a dielectric multilayer film;
    a stacked layer body of nitride semiconductor disposed on an opposite side of the first Bragg reflector from the supporting substrate, the stacked layer body having a first conductive-type layer, a light emitting layer, and a second conductive-type layer stacked in this order;
    a second Bragg reflector made of a dielectric multilayer film and facing the first Bragg reflector across the stacked layer body; and
    a first electrode electrically connected to the first conductive-type layer with the first electrode being disposed between the supporting substrate and the first Bragg reflector such that the first electrode at least partially overlaps the first Bragg reflector when viewed in a stacking direction of the stacked layer body.

2. The nitride semiconductor light emitting element according to claim 1, wherein
    the first electrode is electrically connected to the first conductive-type layer via a first transparent electrode disposed between the first Bragg reflector and the first conductive-type layer, the first transparent electrode protruding outwardly from the first Bragg reflector in a direction perpendicular to a stacking direction of the stacked layer body.

3. The nitride semiconductor light emitting element according to claim 1, wherein
    the first electrode and the first conductive-type layer are electrically connected via a connecting electrode disposed on a side surface of the first Bragg reflector or penetrating through the first Bragg reflector.

4. The nitride semiconductor light emitting element according to claim 3, wherein
    the connecting electrode has a width smaller than a width of the supporting substrate.

5. The nitride semiconductor light emitting element according to claim 1, wherein
    the stacked layer body has a side surface covered with an insulating film and a metal film in this order.

6. The nitride semiconductor light emitting element according to claim 1, wherein
    a part of the stacked layer body on a side of the first conductive-type layer has a width smaller than a width of a part of the stacked layer body on a side of the second conductive-type layer.

7. The nitride semiconductor light emitting element according to claim 1, wherein
    the second Bragg reflector covers a region facing the first Bragg reflector across the stacked layer body.

8. The nitride semiconductor light emitting element according to claim 2, further comprising
    an insulating layer having an aperture and disposed contiguous to the first conductive-type layer, and
    a second electrode having an aperture and disposed over the second conductive-type layer,
    the first transparent electrode covering the aperture of the insulating layer,
    the second Bragg reflector being disposed at least at the aperture of the second electrode, and
    the second Bragg reflector having an area larger than an area of the first Bragg reflector disposed at the aperture of the insulating layer.

9. The nitride semiconductor light emitting element according to claim 8, wherein the insulating layer is disposed above the connecting electrode.

10. The nitride semiconductor light emitting element according to claim 1, wherein
the second Bragg reflector is a light emitting side of the nitride semiconductor light emitting element.

11. The nitride semiconductor light emitting element according to claim 2, wherein
the first transparent electrode includes at least one element selected from the group consisting of zinc, indium, tin, and magnesium.

12. The nitride semiconductor light emitting element according to claim 11, wherein
the first transparent electrode is made of conductive oxide selected from the group consisting of ZnO, $In_2O_3$, $SnO_2$, ATO, ITO, and MgO.

13. The nitride semiconductor light emitting element according to claim 1, wherein
the first Bragg reflector includes a multilayer structure selected from the group consisting of a combination of $SiO_2$ layer and $Nb_2O_5$ layer, a combination of $SiO_2$ layer and $ZrO_2$ layer, and a combination of $SiO_2$ layer and AlN layer.

14. The nitride semiconductor light emitting element according to claim 1, wherein
the first Bragg reflector has one of a circular shape, an oval shape and a rectangle shape when viewed in the stacking direction of the stacked layer body.

15. The nitride semiconductor light emitting element according to claim 1, wherein
the first electrode is made of material selected from the group consisting of (Ti/Si)—Pt—Pd, Ti—Pt—Au—(Au/Sn), Ti—Pt—Au—(Au/Si), Ti—Pt—Au—(Au/Ge), Ti—Pt—Au—In, Au—Sn, In, Au—Si, Au—Ge, and Al—Rh—Au—(Au/Sn).

16. The nitride semiconductor light emitting element according to claim 8, wherein the second electrode is made of material selected from the group consisting of Ni—Au system, Ni—Au—Pt system, Pd—Pt system, Ni—Pt system, Ti—Pt—Au system, and Ti—Al—Au system.

17. The nitride semiconductor light emitting element according to claim 1, wherein the first Bragg reflector and the second Bragg reflector are made of the same material.

18. The nitride semiconductor light emitting element according to claim 1, wherein
the second Bragg reflector has a larger surface area than the first Bragg reflector when viewed in the stacking direction of the stacked layer body.

19. The nitride semiconductor light emitting element according to claim 1, wherein
the nitride semiconductor light emitting element is a vertical cavity surface emitting laser.

20. The nitride semiconductor light emitting element according to claim 1, wherein
the supporting substrate is selected from the group consisting of a semiconductor substrate, a single metal substrate, and a metal substrate made of a complex of two or more metals.

* * * * *